(12) United States Patent
Bachman et al.

(10) Patent No.: US 12,310,165 B2
(45) Date of Patent: May 20, 2025

(54) TRILAYER PHOTORESIST SYSTEM AND METHOD FOR PATTERNING ORGANIC DEVICES

(71) Applicant: Avalon Holographics Inc., St. John's (CA)

(72) Inventors: Daniel Bachman, Edmonton (CA); Qianshu Wang, St. John's (CA); Mohammad Maadi, Edmonton (CA)

( * ) Notice: Subject to any disclaimer, the term of this patent is extended or adjusted under 35 U.S.C. 154(b) by 477 days.

(21) Appl. No.: 17/810,240

(22) Filed: Jun. 30, 2022

(65) Prior Publication Data

US 2023/0006165 A1     Jan. 5, 2023

Related U.S. Application Data

(60) Provisional application No. 63/217,776, filed on Jul. 2, 2021.

(51) Int. Cl.

| | |
|---|---|
| *H10K 50/125* | (2023.01) |
| *H10K 50/12* | (2023.01) |
| *H10K 59/30* | (2023.01) |
| *H10K 71/16* | (2023.01) |
| *H10K 71/20* | (2023.01) |
| *H10K 85/10* | (2023.01) |

(52) U.S. Cl.
CPC .......... *H10K 50/125* (2023.02); *H10K 50/12* (2023.02); *H10K 59/30* (2023.02); *H10K 71/166* (2023.02); *H10K 71/233* (2023.02); *H10K 85/10* (2023.02)

(58) Field of Classification Search
None
See application file for complete search history.

(56) References Cited

U.S. PATENT DOCUMENTS

| | | |
|---|---|---|
| 6,509,137 B1 | 1/2003 | Wang et al. |
| 7,435,671 B2 | 10/2008 | Fuller et al. |
| 9,857,686 B2 | 1/2018 | Ogihara et al. |
| 10,049,876 B1 | 8/2018 | Sankarapandian et al. |
| 10,134,991 B2 | 11/2018 | Choi et al. |
| 10,431,743 B2 | 10/2019 | Xing |
| 10,930,875 B2 | 2/2021 | Lee et al. |
| 2018/0190907 A1* | 7/2018 | Kim .......................... G03F 7/26 |

(Continued)

FOREIGN PATENT DOCUMENTS

| | | |
|---|---|---|
| EP | 0239488 | 9/1987 |
| EP | 3175496 B1 | 6/2021 |

OTHER PUBLICATIONS

Kruger, James B., Michael M. O'Toole, and Paul Rissman. "Trilayer resist." VLSI Electronics Microstructure Science. vol. 8. Elsevier, 1984. 91-136.

(Continued)

*Primary Examiner* — Daniel Whalen

(57) ABSTRACT

A trilayer resist system design and method for patterning organic devices including organic light emitting diode (OLED) devices suited for high-definition light field displays. The trilayer resist system is comprised of a fluoropolymer base layer, an inorganic transfer layer and a top positive-type photoresist layer that protects organics formed upon a substrate from damage resulting from the radiation, developers and solvents used in traditional photolithography techniques and thereby resulting in a high-resolution multi-colored OLED array.

24 Claims, 32 Drawing Sheets

(56) References Cited

U.S. PATENT DOCUMENTS

| | | | |
|---|---|---|---|
| 2018/0261769 A1* | 9/2018 | Kwon | H10K 50/824 |
| 2019/0173046 A1* | 6/2019 | Jeong | H10K 59/131 |
| 2020/0243791 A1 | 7/2020 | Campbell et al. | |
| 2021/0217998 A1* | 7/2021 | Son | H10K 71/621 |
| 2022/0052305 A1 | 2/2022 | Kwon et al. | |

OTHER PUBLICATIONS

Lin, B. J. Introduction To Microlithography Chapter 6, "Multi-layer resist systems." 1983. pp. 287-350.

Namatsu, H., Y. Ozaki, and K. Hirata. "High resolution trilevel resist." Journal of Vacuum Science and Technology 21.2 (1982): 672-676.

Quero, José M. et al. Microfabrication technologies used for creating smart devices for industrial applications, Smart Sensors and MEMs (Second Edition), Woodhead Publishing Series in Electronic and Optical Materials, 2018, pp. 291-311.

\* cited by examiner

TRILAYER PHOTORESIST SYSTEM AND METHOD FOR PATTERNING ORGANIC DEVICES

CROSS-REFERENCE TO RELATED APPLICATIONS

This application claims priority to U.S. Patent Application Ser. No. 63/217,776, filed on Jul. 2, 2021, the contents of which are incorporated herein by reference in their entirety.

FIELD OF THE INVENTION

The present disclosure relates to semiconductor processing techniques, and more particularly, photolithography techniques using photoresist systems for patterning organic devices.

BACKGROUND OF THE INVENTION

Due to the sensitive nature of organics to temperature and other materials, organic light emitting diodes (OLEDs) are inherently difficult to pattern. These structures are traditionally deposited using evaporation through a shadow mask. Deposition through a shadow mask typically includes placing a template in front of a substrate that blocks the substrate everywhere except the desired deposition locations for the OLED material. Conventional patterning methods such as lithography are generally not used since OLEDs are comprised of organic materials and said organic materials are susceptible to being dissolved or degraded by the solvents required for photoresist techniques found in conventional lithography. If it were not for this limitation, conventional lithography methods would be the most straightforward method in fabrication of OLED structures and other organic devices.

A common deposition method used to deposit and for patterning organic devices and in particular OLED devices involves the use of a fine metal mask, which is a type of shadow mask. A shadow mask can be a large sheet that is generally made as thin as possible with small holes. Deposition occurs through a point source in which organics are evaporated onto the mask and through these holes, the organics that come through this point source then end up on the substrate at the appropriate locations as dictated by the mask. Due to limitations in how small the holes in the shadow mask can be, how thin the shadow mask can be made, and how close to the substrate the shadow mask can be placed among other reasons, there is a resolution limit limiting the feature size and density of the patterned organics. Among the challenges created by the physical dimensions of the shadow mask is a shadowing effect whereby material is deposited underneath the masked regions of the shadow mask and unmasked regions have non-uniform deposition. The shadowing effect occurs during deposition underneath physically masked regions of the substrate due to off normal arrival angles of the evaporated material. The thickness of the shadow mask is one factor that determines how much of an undesired shadowing effect there is on the substrate which leads to the resolution limit one can pattern the organics to. Therefore, it is desirable to have a very thin shadow mask if the shadow mask is too thin, there is a risk of mask breaking or deforming. Due to the target dimensions of high-resolution OLED for light field display technology, photolithography is an ideal deposition technique as it is mature and well-developed, often used for small-scale patterning of semiconductors and metals. It should be noted however that the materials generally used in the fabrication of semiconductors and metals in particular are much less process-sensitive than organic materials. Many microfabrication processes are designed to strip away organics through development, as in many instances, organics are viewed as contaminants. In particular, standard photolithography cleaning procedures are designed to remove organic contaminants.

There are specially formulated resist systems that utilize solvents which are safe for organic materials. These specially formulated systems typically utilize a two-layer photolithography liftoff scheme, wherein the bottom photolithography layer is used as a sacrificial layer while the top layer is a photosensitive resist layer. In one technique, the bottom layer is spun on a wafer and baked before the top layer is spun, baked, and patterned. The basis of this type of photoresist system is that the top and bottom layers dissolve in different solvents, or at least at different rates in the same solvent, allowing for selective etching, or removal, of each of the two layers. For patterning of organics, a lift-off technique is often utilized where an undercut profile is created in the photosensitive resist layers to create a cavity structure where the top layer of resist is overhanging an opening in the bottom layer of resist. The material to be lifted off is then deposited through the opening and the cavity under the overhang resist profile leaves additional space for solvents to access the resist system after deposition of the desired material, leaving the deposited material in the patterned openings.

It has been demonstrated that exposure to ultraviolet (UV) light, as required for the photolithography process used with these specially formulated resist systems, may be damaging to OLED structures. Some organic-safe resist systems use a negative photoresist top layer, which must be exposed to UV light during patterning. A negative photoresist is a type of photoresist wherein the region of the photoresist that is exposed to light becomes insoluble to the photoresist developer. Specifically, the negative photosensitive resist material is strengthened, by polymerization or cross-linking, in the presence of UV light. Following exposure of the negative photoresist to light through a light mask, also referred to herein as a photomask, the developer will dissolve the regions that were not exposed to light, leaving behind a coating of resist in areas of the negative photoresist layer not exposed to UV light. The photomask has opaque and transparent regions to allow UV light to pass through, forming the desired pattern in the photoresist. The unexposed region of the photoresist is then dissolved by the photoresist developer, such as, for example, a buffered KOH developer. In contrast to a negative photoresist, a positive photoresist is a type of photoresist wherein the region of the photoresist exposed to UV light becomes soluble to the photoresist developer. In the case of a positive photoresist, the photosensitive material is changed by light and the developer will dissolve away the regions that were exposed to light through the transparent regions of the photomask, with remaining photoresist material under the opaque regions of the photomask (i.e. regions not exposed to UV light). The unexposed regions of the photoresist remain insoluble to the photoresist developer and serves as the protective layer in the photolithography process. Positive photoresists are well known in the art and highly controllable, however traditionally have not been able to be used when patterning OLED structures due to the damaging nature of their developers to organic materials.

According to Lin (Multi-Layer Resist Systems, INTRODUCTION TO MICROLITHOGRAPHY Chapter 6, pp.

287-350, 1983), the history of trilayer resists begins in the liftoff era of microelectronics in the early 1970s. There was a desire to perform liftoff for microelectronics fabrication at the time and the trilayer resist system proved to be a strong candidate. The basic elements of this resist system include an imaging layer, an inorganic transfer layer, and a bottom sacrificial layer. The bottom sacrificial layer is typically a hard-baked photoresist while the inorganic transfer layer is a metal or dielectric material and the imaging layer is a conventional photoresist. After coating the wafer in the trilayer resist, the imaging layer is exposed and developed and then the inorganic transfer layer is etched. The system is then exposed to an oxygen plasma to transfer the pattern to the sacrificial layer. The oxygen plasma can be designed to produce an undercut in the resist and remove the imaging layer for an ideal liftoff profile. In projection lithography, it is important that the imaging layer be all in the same plane. At this time, planarization techniques, such as chemical-mechanical polish, were unavailable, therefore lithography was performed over topography.

In one example of the use of a trilayer resist for semiconductor processing, U.S. Pat. No. 10,049,876 to Sankarapandian et al. describes a method that includes forming a trilayer resist structure having a middle layer disposed between a top layer and a bottom layer. This trilayer resist method is used to remove a material in a directional way from a specialized type of transistor, while not damaging nearby similar transistors. The function of this trilayer resist is to first planarize the surface and then to act as a hard mask for an etching process. To remove the middle layer of resist, a material similar to, or the same as, the bottom layer of the trilayer resist structure, is applied to planarize and etch back a chemical-mechanical polish (CMP) layer to a level that is below the middle layer of resist. The middle layer can then be removed by an etching procedure that would normally harm the rest of the substrate, however due to the additional planarization layer the substrate is covered and protected from the etch that removes the middle layer. The remaining planarization layer is finally removed using a dry or wet stripping process.

In traditional dual-layer photoresist systems for patterning organics, the bottom, or base layer, is a sacrificial layer which helps to create the desired undercut profile for patterning OLEDs. To use a conventional resist for the base layer of an organic-safe resist system require developers to first create an undercut profile using a resist that can be removed without damaging the deposited organics. As previously mentioned, the chemical photolithographic developers used for traditional photolithography processes (i.e. for a positive type photoresist) are generally harmful to organic materials. Accordingly, there has been a barrier to the development of photolithography techniques for the fabrication of small-scale organic devices, and specifically nano-scale OLED devices suitable for high resolution display applications.

This background information is provided for the purpose of making known information believed by the applicant to be of possible relevance to the present invention. No admission is necessarily intended, nor should be construed, that any of the preceding information constitutes prior art against the present invention.

SUMMARY OF THE INVENTION

It is an object of the present invention to provide a trilayer photolithography technique that can be used to pattern organic light emitting diodes (OLEDs).

In an aspect of the present invention there is provided a method for patterning an organic device comprising: depositing a bottom electrode on a substrate; depositing a trilayer resist system on the substrate comprising: a fluoropolymer base layer; an intermediate inorganic transfer layer; and a top positive-type photoresist layer; and creating at least one organic device by: patterning the top positive-type photoresist layer using photolithography to create an image layer aligned with the bottom electrode; etching the intermediate inorganic transfer layer exposed through the image layer; etching the fluoropolymer base layer exposed through the inorganic transfer layer to expose the bottom electrode; depositing at least one organic layer above the exposed bottom electrode; performing a liftoff procedure to remove any remaining components of the trilayer resist system; and depositing a top electrode on top of the organic layer.

In an embodiment of the method the organic device is an organic light emitting diode.

In another embodiment of the method the organic device is an organic field-effect transistor, organic solar cell, photovoltaic cell device, organic semiconductor, or an organic laser.

In another embodiment of the method etching the fluoropolymer base layer exposed through the inorganic transfer layer comprises using reactive ion etching to expose the bottom electrode.

In another embodiment of the method the fluoropolymer base layer has a visible light transmission ratio of 95% or greater.

In another embodiment of the method the positive-type photoresist layer has a thickness of between about 340-500 nm.

In another embodiment of the method etching the inorganic transfer layer through the patterned positive-type photoresist layer creates an undercut region between the positive-type photoresist image layer and the inorganic transfer layer.

In another embodiment of the method etching the fluoropolymer base layer creates a lateral undercut profile and a longitudinal undercut profile.

In another embodiment of the method the lateral undercut profile is ≥0.25 μm in length.

In another embodiment of the method the liftoff procedure utilizes a fluorinated solvent to dissolve the fluoropolymer base layer.

In another embodiment of the method the inorganic transfer layer comprises one or more of a metal and a dielectric material.

In another embodiment of the method the at least one organic layer comprises one or more electron transport layers (ETL), emission layers (EML), hole transport layers (HTL), and hole injection layers (HIL).

In another embodiment of the method the emission layers (EML) is at least one of red, green, and blue color emission.

In another embodiment of the method an oxide layer is deposited on the substrate and electrode array before deposition of the trilayer resist system. In another embodiment of the method the oxide layer comprises a transparent conducting oxide.

In another aspect there is provided a method for patterning an organic device array comprising: depositing an array of bottom electrodes on a substrate; depositing a trilayer resist system on the substrate using a trilayer resist deposition method comprising: a fluoropolymer base layer; an intermediate inorganic transfer layer; and a top positive-type photoresist layer; and creating a plurality of organic devices for a first set of organic devices using an organic device deposition method comprising: patterning the top positive-type photoresist layer using photolithography to create an image layer aligned with a set of the array of bottom electrodes; etching the intermediate inorganic transfer layer exposed through the image layer; etching the fluoropolymer base layer exposed through the inorganic transfer layer to expose the set of the array of bottom electrodes; depositing at least one organic layer above the set of exposed bottom electrodes; performing a liftoff procedure to remove any remaining components of the trilayer resist system; and repeating the trilayer resist deposition method to deposit the trilayer resist system on the substrate; repeating the organic device deposition method to create a second set of organic devices aligned with a second set of bottom electrodes; and repeating the liftoff procedure to remove any remaining components of the trilayer resist system.

In an embodiment, the method further comprises depositing a top electrode on top of each of the organic devices.

In another embodiment of the method the organic device is an OLED, and wherein the first set of organic devices and the second set of organic devices emit different colors.

In an embodiment, the method further comprises repeating the trilayer resist deposition method to deposit a trilayer resist system on the substrate; repeating the organic device deposition method to create a third plurality of organic devices aligned with a third set of bottom electrodes; and performing a liftoff procedure to remove any remaining components of the trilayer resist system.

In another embodiment of the method etching the inorganic transfer layer through the patterned positive-type photoresist image layer creates an undercut region between the positive-type photoresist image layer and the inorganic transfer layer.

In another embodiment of the method etching the fluoropolymer base layer creates a lateral undercut profile and a longitudinal undercut profile.

In another embodiment of the method the lateral undercut profile is ≥0.25 µm in length.

In another embodiment of the method the liftoff procedure utilizes a fluorinated solvent that interacts and dissolves the fluoropolymer base layer.

In another embodiment of the method the first set of organic devices and the second set of organic devices are each for at least one of red, green, or blue color emission.

In another embodiment of the method the inorganic transfer layer comprises one or more metal or dielectric material.

In another embodiment of the method the organic layer is an organic stack comprising one or more electron transport layers (ETL), emission layers (EML), hole transport layers (HTL), and hole injection layers (HIL).

In another aspect there is provided a method for patterning an organic device array comprising: depositing a plurality of bottom electrodes on a substrate; depositing a trilayer resist system on the substrate using a trilayer resist deposition method comprising: a fluoropolymer base layer; an intermediate inorganic transfer layer; and a top positive-type photoresist layer; and creating a plurality of organic devices using an organic device deposition method comprising: patterning the top positive-type photoresist layer using photolithography to create an image layer aligned with the plurality of bottom electrodes; etching the intermediate inorganic transfer layer exposed through the image layer; etching the fluoropolymer base layer exposed through the inorganic transfer layer to expose the plurality of bottom electrodes; and depositing at least one organic layer above the set of exposed bottom electrodes; and performing a liftoff procedure to remove any remaining components of the trilayer resist system.

In another aspect there is provided a method for patterning an organic light emitting diode (OLED) array comprising: depositing a plurality of bottom electrodes on a substrate in an array; depositing a trilayer resist system comprising: a fluoropolymer base layer; an inorganic transfer layer; and a positive-type photoresist image layer; and creating an array of OLED devices by: patterning the positive-type photoresist image layer by exposing the positive-type photoresist image layer to ultraviolet light and removing the patterned positive-type photoresist image layer that has been exposed to the ultraviolet light by etching; etching the inorganic transfer layer through the patterned positive-type photoresist image layer; etching the fluoropolymer base layer exposed through the inorganic transfer layer using reactive ion etching to expose at least some of the plurality of bottom electrodes; depositing an organic stack onto each of the exposed bottom electrodes; performing a liftoff procedure to remove any remaining components of the trilayer resist system; and depositing a top electrode on the organic stack.

In an embodiment, an oxide layer is deposited on the substrate before deposition of the trilayer resist system.

In another embodiment, the oxide layer is a transparent conducting oxide.

In another embodiment, the fluoropolymer base layer has a visible light transmission ratio of 95% or greater.

In another embodiment, the fluoropolymer base layer further comprises a light absorbing dye.

In another embodiment, the thickness of the positive-type photoresist image layer is 400-600 nm.

In another embodiment, etching the inorganic transfer layer through the patterned positive-type photoresist image layer creates an undercut region between the positive-type photoresist image layer and the inorganic transfer layer.

In another embodiment, etching the fluoropolymer base layer creates a lateral undercut profile and a longitudinal undercut profile.

In another embodiment, the lateral undercut profile is ≥0.25 µm in length.

In another embodiment, the liftoff procedure utilizes a fluorinated solvent that interacts and dissolves the fluoropolymer base layer.

In another embodiment, the inorganic transfer layer comprises one or more metal or dielectric material.

In another embodiment, the dielectric material is or comprises $SiO_2$ or Aluminum.

In another embodiment, the photolithography technique involves using a developer that is not penetrated through the transfer layer.

In another embodiment, the developer is a buffered KOH developer.

In another embodiment, the organic stack is for at least one of red, green, or blue color emission.

In another embodiment, a post exposure bake process is required after etching the inorganic transfer layer or etching the fluoropolymer base layer.

In another embodiment, the post exposure bake process is executed at a temperature≤120° C.

In another embodiment, the liftoff procedure comprises immersing the substrate in a fluorosolvent to interact with and dissolve the fluoropolymer base layer but does not interact with the organic stack.

In another aspect there is provided a method for patterning a multi-color organic light emitting diode (OLED) array, the method comprising: depositing a first series of bottom electrodes and a second series of bottom electrodes on a substrate in an array; depositing a trilayer resist system comprising: a fluoropolymer base layer; an inorganic transfer layer; and a positive-type photoresist image layer; and creating a multicolor array of OLED devices by: patterning the positive-type photoresist image layer at locations above the first series of bottom electrodes by exposing the positive-type photoresist image layer to ultraviolet light and removing the patterned positive-type photoresist image layer that has been exposed to the ultraviolet light by etching; etching the inorganic transfer layer through the patterned positive-type photoresist image layer; etching the fluoropolymer base layer exposed through the inorganic transfer layer using reactive ion etching to expose at least some of the first series of bottom electrodes; depositing a first color organic stack onto the exposed first series of bottom electrodes; performing a liftoff procedure to remove any remaining components of the trilayer resist system; depositing the trilayer resist system; patterning the positive-type photoresist image layer above the second series of bottom electrodes by exposing the positive-type photoresist image layer to ultraviolet light and removing the patterned positive-type photoresist image layer that has been exposed to the ultraviolet light by etching; etching the inorganic transfer layer through the patterned positive-type photoresist image layer; etching the fluoropolymer base layer exposed through the inorganic transfer layer using reactive ion etching to expose at least some of the second series of bottom electrodes; depositing a second color organic stack onto each of the exposed second series of bottom electrodes; performing a liftoff procedure to remove any remaining components of the trilayer resist system; and depositing a series of top electrodes on the first color organic stacks and second color organic stacks.

In an embodiment, an oxide layer is deposited on the substrate before deposition of the trilayer resist system.

In another embodiment, the oxide layer is a transparent conducting oxide.

In another embodiment, etching the inorganic transfer layer through the patterned positive-type photoresist image layer creates an undercut region between the positive-type photoresist image layer and the inorganic transfer layer.

In another embodiment, etching the fluoropolymer base layer creates a lateral undercut profile and a longitudinal undercut profile.

In another embodiment, the lateral undercut profile is ≥0.25 µm in length.

In another embodiment, the liftoff procedure utilizes a fluorinated solvent that interacts and dissolves the fluoropolymer base layer.

In another embodiment, the first color organic stack is for at least one of red, green, or blue color emission.

In another embodiment, the second color organic stack is for at least one of red, green, or blue color emission.

In another embodiment, the first color organic stack is different from the second color organic stack.

In another embodiment, a post exposure bake process is required after etching the inorganic transfer layer or etching the fluoropolymer base layer.

In another embodiment, the post exposure bake process is executed at a temperature≤120° C.

In another embodiment, the liftoff procedure comprises immersing the substrate in a fluorosolvent to interact with and dissolve the fluoropolymer base layer but does not interact with the first color organic stack or the second color organic stack.

BRIEF DESCRIPTION OF THE DRAWINGS

These and other features of the invention will become more apparent in the following detailed description in which reference is made to the appended drawings.

DETAILED DESCRIPTION OF THE INVENTION

Figure 1A:
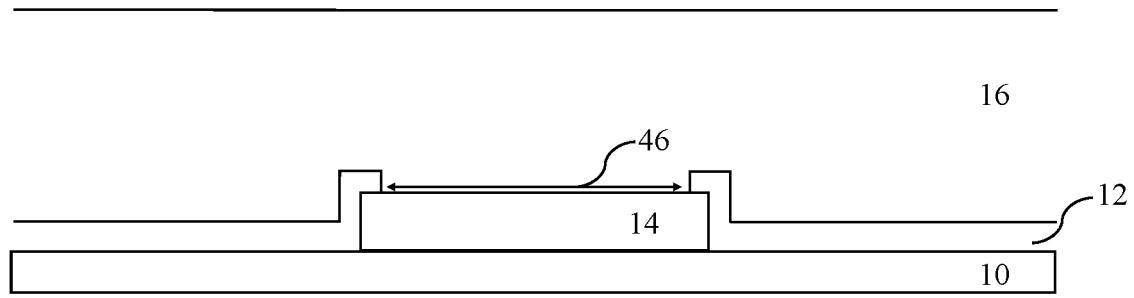
FIG. 1A illustrates a cross section of a substrate following the deposition of the fluoropolymer base layer.

The present disclosure relates generally to a trilayer photoresist system and method for patterning and fabricating organic devices, for example OLED devices. The present method can also be used in patterning OLED arrays and can be used for fabricating OLED devices and OLED arrays for high-resolution, high density, full-parallax three dimensional (3D) light field displays.

Various features of the invention will become apparent from the following detailed description taken together with the illustrations in the Figures. The design parameters, design method, construction, and use of the presently described trilayer photoresist system and method for fabrication of organic devices, as well as the microcavity OLED design process and structures disclosed herein, are described with reference to various examples representing embodiments which are not intended to limit the scope of the invention as described and claimed herein. The skilled technician in the field to which the invention pertains will appreciate that there may be other variations, examples and embodiments of the invention not disclosed herein that may be practiced according to the teachings of the present disclosure without departing from the scope of the invention.

Definitions

Unless defined otherwise, all technical and scientific terms used herein have the same meaning as commonly understood by one of ordinary skill in the art to which this invention pertains.

The use of the word "a" or "an" when used herein in conjunction with the term "comprising" may mean "one," but it is also consistent with the meaning of "one or more," "at least one" and "one or more than one."

As used herein, the terms "comprising," "having," "including" and "containing," and grammatical variations thereof, are inclusive or open-ended and do not exclude additional, unrecited elements and/or method steps. The term "consisting essentially of" when used herein in connection with a composition, device, article, system, use, or method, denotes that additional elements and/or method steps may be present, but that these additions do not materially affect the manner in which the recited composition, device, article, system, method, or use functions. A composition, device, article, system, use, or method described herein as comprising certain elements and/or steps may also, in certain embodiments, consist essentially of those elements and/or steps, and in other embodiments consist of those elements and/or steps, whether or not these embodiments are specifically referred to.

As used herein, the term "about" refers to an approximately +/−10% variation from a given value. It is to be understood that such a variation is always included in any given value provided herein, whether or not it is specifically referred to.

The recitation of ranges herein is intended to convey both the ranges and individual values falling within the ranges, to the same place value as the numerals used to denote the range, unless otherwise indicated herein.

The use of any examples or exemplary language, e.g., "such as", "exemplary embodiment", "illustrative embodiment" and "for example" is intended to illustrate or denote aspects, embodiments, variations, elements, or features relating to the invention and not intended to limit the scope of the invention.

As used herein, the terms "connect" and "connected" refer to any direct or indirect physical association between elements or features of the present disclosure. Accordingly, these terms may be understood to denote elements or features that are partly or completely contained within one another, attached, coupled, disposed on, joined together, in communication with, operatively associated with, etc., even if there are other elements or features intervening between the elements or features described as being connected.

As used herein, the term "transparent conductive oxide" or TCO refers to type of transparent conducting film (TCFs), which are thin films of optically transparent and electrically conductive material. TCO in particular is a doped metal oxide commonly used in optoelectronic devices. Some examples of TCO materials include but are not limited to Indium Tin Oxide (ITO), Fluorine-doped Tin Oxide (FTO), Aluminum-doped Zinc Oxide (AZO), Indium-doped Zinc Oxide (IZO), and Gallium-doped Zinc Oxide (ZnO).

As used herein, the term "ITO" refers to Indium Tin Oxide, which is a composition of indium, tin and oxygen in varying proportions, typically encountered as an oxygen-saturated composition with a formulation of 74% In, 18% $O_2$, and 8% Sn by weight. ITO is commonly used as an anode material in an OLED structure due to its suitable conductivity and ability to be deposited by established methods. ITO is also nearly transparent and colorless. ITO can be used to construct the anode layer in OLEDs according to the present disclosure.

As used herein, the term "organic device" refers to an electronic device comprising an organic layer. As used herein the term "organic device" includes but is not limited to an organic light emitting diode, organic field-effect transistor, organic solar cell, photovoltaic cell device, organic semiconductor, and organic laser.

As used herein, the term "OLED" refers to an organic light emitting diode, an optoelectronic device which emits light upon the application of an external voltage.

As used herein, the term "organic layer" refers to a layer in an organic device that comprises a carbon-based organic material, molecule, or structure. Organic materials can be sensitive to degradation under the radiation wavelength and intensity used in photolithography.

As used herein, the term "microcavity" refers to a structure formed by reflecting faces on two sides of a spacer layer or optical medium, such as, for example, an OLED.

As used herein, the term "microcavity OLED" (MCOLED) refers to an OLED, as previously described, bound in a microcavity defined by two reflective surfaces. The reflective surfaces of the MCOLED can be, for example, metallic materials, dielectric materials arranged in such a way to reflect light within a specific range, a combination of dielectric and metallic materials, or any other reflective surfaces.

As used herein, the term "patterning" refers to a technique used to chemically transfer a pattern into or onto a surface. Photolithography is an example of a patterning technique that uses radiation or light to change the properties of lithographic layers. The term patterning as referred to herein, includes the photolithography steps of exposure of the positive type photoresist to a radiation at a wavelength to degrade the photoresist, making it soluble in a developer solution.

As used herein, the term "photomask" refers to a thin plate or sheet having a plurality of regions that either permit or block the transmissivity of radiation (e.g. UV light) through the plate to the underlying photoresist material used for patterning of said photoresist material during photolithography.

As used herein, the term "blanket deposition" refers to depositing material without using a patterning technique.

As used herein, the term "wavelength" is a measure of distance between two identical peaks (high points) or troughs (low points) in a wave, which is a repeating pattern of traveling energy such as light or sound. The wavelength of light used in photolithography is generally in the ultraviolet region (about 10-450 nm) and more preferably in the deep ultraviolet region (about 200-300 nm) or at wavelengths under 300 nm. Extreme ultraviolet radiation (about 10-125 nm) and x-ray light (10 picometers to 10 nanometers) are also used in some applications of photolithography.

It is contemplated that any embodiment of the compositions, devices, articles, methods and uses disclosed herein can be implemented by one skilled in the art, as is, or by making such variations or equivalents without departing from the scope of the invention.

The present disclosure is directed to semiconductor processing and fabrication techniques, and more particularly, photolithography techniques using photoresist systems for patterning organic devices including organic light emitting diodes (OLEDs) and OLED arrays.

Photoresists are light-sensitive sacrificial materials which are fundamental to photolithography. Photoresist systems are generally comprised of a polymer, a sensitizer, and a solvent. Upon exposure to a radiation source such as UV radiation, the polymer structure of the photoresist material is altered. The solvent component allows the photoresist to be spun and to form thin layers over a wafer, or substrate surface. Finally, the sensitizer, or inhibitor, controls the photochemical reaction in the polymer phase. Photoresists can be classified as positive photoresists (positive-type photoresists) or negative photoresists (negative-type photoresists). The photochemical reaction that occurs for positive photoresists during exposure to a radiation source weakens the polymer, making it more soluble to the developer, resulting in a positive pattern. Therefore, for a positive photoresist, the photomask used will have the same pattern as that desired for patterning on the semiconductor layer. Alternatively for negative photoresists, exposure to a UV radiation source causes polymerization of the polymer. This polymerization results in the negative photoresist layer region exposed to the UV light becoming insoluble to the photoresist developer. The negative photoresist regions that had been exposed to the radiation source will remain upon the surface of the wafer, or substrate, following the chemical treatment with a developer solution. Therefore, masks used for negative photoresists contain the inverse or photographic "negative" of the pattern to be transferred.

A mask, or photomask, controls where the semiconductor wafer or substrate is exposed to radiation by either permitting or blocking transmissivity of the radiation through the photomask through to the underlying photoresist material. Regions of the photomask structure that permit transmissivity of radiation will result in degradation of an underlying positive photoresist material or a polymerization of an underlying negative photoresist material layer (Microfabrication technologies used for creating smart devices for industrial applications. Jose M. Quero, Carmen Aracil, in Smart Sensors and MEMs (Second Edition), Woodhead Publishing Series in Electronic and Optical Materials, 2018, Pages 291-311). Radiation used in photolithography is generally ultraviolet (UV) or extreme UV, however x-rays can also be used. The wavelength of light used determines the minimum feature size that it can impress on the photoresist. UV radiation is generally referred to herein as the photolithography light source, however it is understood that a variety of wavelengths of light may be used according to the desired process materials and results. The photomask comprises an opaque plate with perforations or transparent regions that allows light to shine through (transmit) at defined locations in a particular pattern. Photomask materials can include, for example, fused silica (quartz glass)

with a coating pattern made of chrome. In some cases, the photomask can be further coated with Teflon™ or other low-friction, low-stick coating to help prevent stiction issues during contact photolithography. By placing the photomask between the photoresist and a light source capable of degrading the polymer in the positive photoresist an exact copy of the pattern on the photomask can be created by degrading the photoresist at the holes or transparencies in the photomask pattern. As previously mentioned, for negative photoresists, the photomask will have the inverse of the desired pattern. Both negative and positive photoresists have advantages and disadvantages. Advantages of negative photoresists include good adhesion to silicon, low cost, and short processing time. Further, more desirable advantages of positive photoresists include increased controllability, good resolution, and good thermal stability.

Positive photoresists are suitable, to a limited extent, for lift-off processes because positive photoresists do not cross-link or further polymerize upon light exposure, therefore maintaining the softening point of the photoresist layer to values in the range of approximately 110-130° C. Cross-linking refers to the polymerization or bonding of one polymer chain to another to create polymer chains or a polymer network. In chemical applications, cross-linking can be used to promote a change in the physical properties of the polymer. Temperatures in the range of 110-130° C. are often used during typical coating processes in the fabrication of semiconductor devices. The resist features will become coated overall, making lift-off difficult or impossible if the positive photoresist were to polymerize within the 110-130° C. temperature range. Additional advantages of using positive photoresists for semiconductor fabrication include that a positive photoresist generally does not swell during development, is capable of finer resolution, and is reasonably resistant to plasma processes. Negative photoresists are generally considered to be a better choice for lift-off processes as these polymers can achieve a reproducible undercut in the fabrication layers. This undercut helps to prevent the photoresist sidewalls from being coated as the crosslinking of the polymer resin of common negative resists maintains the undercut, making subsequent lift-off of sacrificial layers easier.

Herein is described a trilayer photoresist structure and method of use thereof. The trilayer system is comprised of a fluoropolymer base layer, an intermediate inorganic layer, and a top positive-type photoresist layer, that can be used for patterning nano-scale organic structures, such as OLEDs, using photolithography techniques. The disclosed trilayer resist system avails of the advantages of photolithographic patterning using conventional photoresists by including an intermediate inorganic transfer layer between a top positive photoresist, also referred to as a positive-type photoresist layer, and a fluoropolymer base layer. The implementation of a positive photoresist as the top layer which forms an image layer upon patterning allows for the fabrication of a finer pattern through the trilayer photoresist structure, leading to increased resolution of the resulting organic devices and a more controllable photolithography process. As previously mentioned, when using a photomask with a positive photoresist, radiation (UV light) is passed through transparent regions in the mask, defining the regions where the positive photoresist material will be subsequently removed with a developer. Using a positive photoresist with a photomask is particularly advantageous when patterning an high density OLED array as regions on the underlying substrate that have organics already deposited thereon are shielded from UV light rays during patterning of a subsequent OLED color by the opaque regions of the photomask. In particular, the combination of a positive photoresist and opaque photomask blocks photolithography radiation from penetrating below the photomask into areas of the substrate and organic device that contain organic materials sensitive to the radiation. In comparison, patterning organics using a negative photoresist dual layer system, for example using photolithography and a photomask, exposes the substrate underneath the negative photoresist layer to the radiation used to polymerize or harden the negative photoresist regions. Any structures underneath the negative photoresist on the underlying substrate that have an existing organic layer deposited thereon are therefore also exposed to radiation (UV light rays) during patterning of any subsequent organic stack (i.e. an additional OLED color), potentially damaging the organic layer. As such, radiation exposure required for the hardening or polymerizing step in a negative photoresist treatment can penetrate into layers below the negative photoresist, thereby damaging underlying organic layers.

The described trilayer resist system comprises a bottom fluoropolymer base layer, an inorganic transfer layer, and a top positive-type resist which forms the image layer. The intermediate inorganic transfer layer acts as a protective barrier for the fluoropolymer base layer. The presence of this protective inorganic transfer layer facilitates the implementation of a top, positive-type resist image layer. The positive-type photoresist image layer can then be patterned using conventional photolithography techniques for positive-type photoresists, thereby avoiding degradation of previously deposited organic materials on the substrate caused by UV light exposure. The fluoropolymer base layer can be developed and lifted off the substrate using a perfluorinated solvent which is not harmful to organic materials during the liftoff process.

The term "organic stack" as used with reference to OLED devices refers to the layers in the OLED that include an organic layer where a light beam is formed between two electrodes. These layers may include one or more electron transport layer, emission layer, hole transport layer, and hole injection layer, where the emission layer is an organic layer and the other layers can be either inorganic, organic, or combinations of organic and inorganic. In other organic devices, for example, an organic solar cell, one or more of each of these layers can comprise organic materials sensitive to the radiation used in photolithography. Therefore, the term "organic stack" refers to one or more layers, one of which being a layer formed of an organic material and may be replaced by a single organic layer for alternative embodiments of the disclosure (i.e. alternative organic devices).

The intermediate inorganic transfer layer of the disclosed trilayer resist system acts as a critical barrier layer by preventing penetration of the harmful developer used for patterning the top positive photoresist material, through to the underlying fluoropolymer base layer and any organic material present under said base layer.

The fluoropolymer base layer is a sacrificial layer that functions to create the desired undercut profiled for patterning for organic devices, and specifically for OLED devices. The trilayer system described herein employs a fluoropolymer base layer which, after exposure through the intermediate inorganic transfer layer, is etched with oxygen plasma or reactive ion etching (RIE) to create a microcavity, preferably with an undercut, through which the organic stack can be deposited.

The presently described trilayer resist system allows for the implementation of photolithography techniques for patterning organic devices and organic light emitting diodes at a sub 10 µm scale, with a highly controllable photoresist as the top positive-type resist image layer. The described trilayer resist system can further liftoff organics in a reliable way, providing a high-density OLED array, that is scalable to substrate sizes not currently possible for patterning OLEDs at the target sub 10 µm dimension. In comparison, present OLED devices using a shadow mask are not scalable to a flat panel display. Although OLED fabrication is provided herein as an example of how the present trilayer photoresist system can be used, it is understood that the same trilayer photoresist fabrication system and method can be used to fabricate other devices comprising organic semiconductor layers, for example organic-based field-effect transistors, organic-based solar cells, photovoltaic cell devices, other organic-based semiconductor devices, and organic laser devices.

OLEDs are generally divided into two main classes: those comprised of small organic molecules and those comprised of organic polymers. An OLED is a light-emitting diode in which the emissive electroluminescent layer comprises a film of organic compound or component that emits light in response to an electric current. Generally, an OLED is a solid-state semiconductor device having at least one conducting organic layer disposed between and electrically connected to an anode and a cathode. When a current is applied, the anode injects holes, and the cathode injects electrons into the organic layers, and the injected holes and electrons each migrate toward the oppositely charged electrode. When an electron and hole localize on the same molecule, an exciton, which is a localized electron-hole pair having an excited energy state, is formed. Light is emitted when the exciton relaxes via a photoemissive mechanism. Types of OLEDs include but are not limited to Active-matrix OLEDs (AMOLEDs), Top-emitting OLEDs, and Bottom-emitting OLEDs. AMOLEDs have full layers of cathode, organic molecules, and anode. The anode layers have a thin film transistor (TFT) plane in parallel to it to form a matrix. This helps in switching each pixel to its on or off state as desired, thus forming an image. Hence, the pixels switch off whenever they are not required or there is a black image on the display, increasing the battery life of the device. This is the least power consuming type of OLED and has quicker refresh rates which makes them suitable for video. Some uses for AMOLEDs are in computer monitors, large-screen TVs and electronic signs or billboards. Top-emitting OLEDs have a substrate that is either opaque or reflective. Top-emitting OLEDs are better suited for active-matrix applications as they can be more easily integrated with a non-transparent transistor backplane. Manufacturers use top-emitting OLED displays in devices such as smart cards. An OLED is bottom emitting if the emitted light passes through the transparent or semi-transparent bottom electrode and substrate.

Typically, in the fabrication of organic devices, organic layers are deposited onto an organic device through a fine metal mask (FMM), or shadowmask, which is acceptable for creating larger pixels (10s of µm scale). However, to achieve the pixel density required for a high-definition light field display must be in the sub-10 µm range. The presently disclosed trilayer resist system allows for the patterning of organics using traditional photolithographic processes at a much finer resolution. Additionally, the present trilayer system can be used in multiple iterations on a single device, enabling fabrication of multiple independent organic stack structures on the same substrate. Previously deposited organic layers are first protected from degradation by radiation through use of a positive photoresist top layer (an opaque photomask) and by the intermediate inorganic transfer layer which acts as a critical barrier layer by preventing penetration of the harmful developer, used for patterning the top positive photoresist material, through to the underlying fluoropolymer base layer and any organic material present under said base layer.

In patterning the trilayer resist system using photolithography techniques using a photomask, at least one electrode is exposed for deposition of the organic stack or one or more organic layers. For example, in patterning an OLED device (or OLED array), the active area is defined as the region comprising an exposed bottom electrode, which was deposited on the substrate in an array prior to application of the trilayer photoresist system. Generally, the active area defines the boundaries where first level electrical connections will be made while predetermining the pattern shape and resolution of the organic device(s). Accordingly, the horizontal offset of the trilayer resist system from the active area also affects the shadowing of the organics, with greater offset expected to lead to less shadowing.

Alternatively, in the disclosed trilayer resist system, patterning using maskless photolithography (without a physical mask) is also an option, otherwise known as direct-write lithography. Direct-write lithography refers to any technique that is capable of depositing, removing, dispensing, altering the chemistry, or processing various types of materials over different surfaces following a predetermined layout or pattern. In the present application, direct-write lithography can be used, for example, to expose the positive photoresist top layer in a desired pattern for organic layer deposition on the substrate or bottom electrode.

Figure 1B:
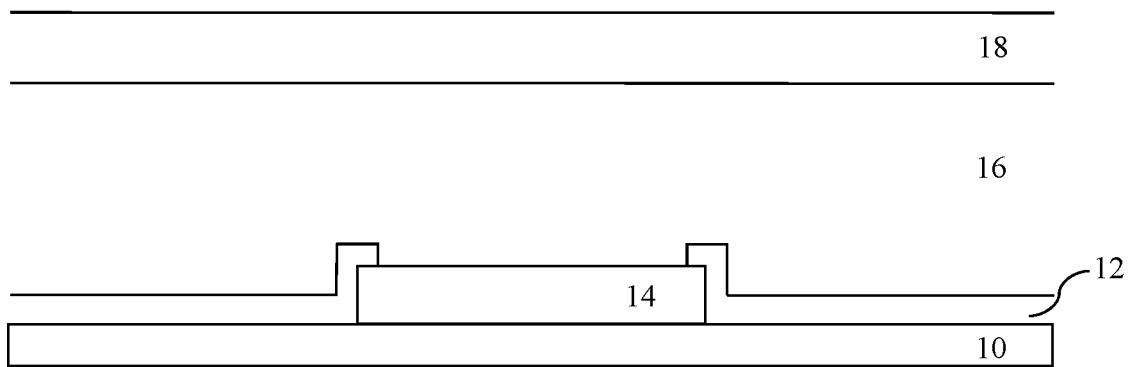
FIG. 1B illustrates a cross section of a substrate following the deposition of the inorganic transfer layer.
Figure 1C:
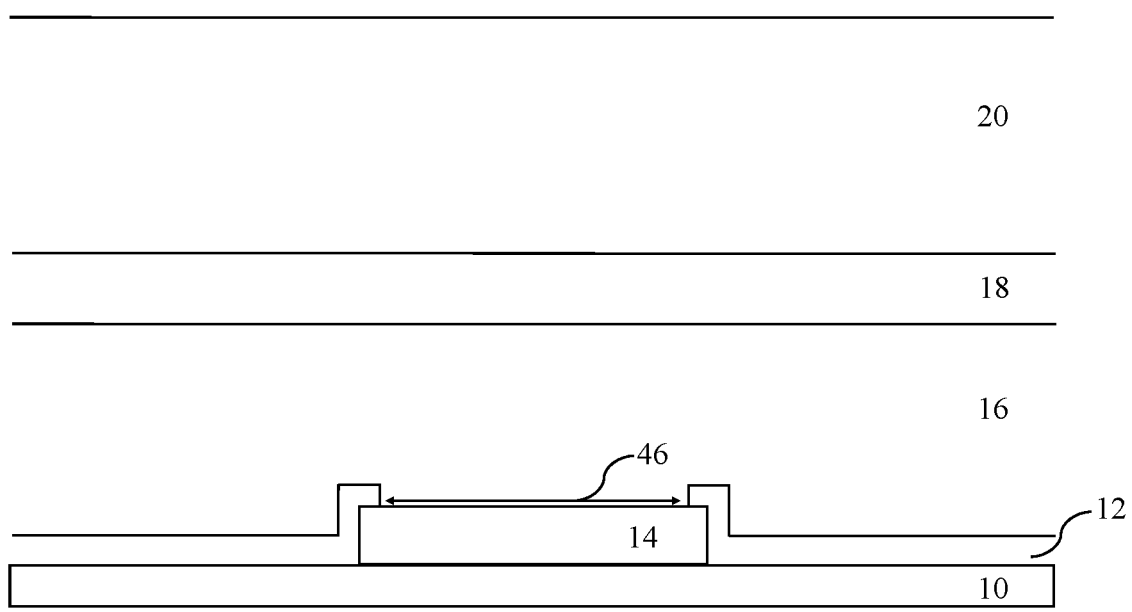
FIG. 1C illustrates a cross section of a substrate with an electrode substrate following the deposition of the positive-type resist image layer, thereby forming the trilayer resist system.

FIGS. 1A-1C illustrate the deposition of the trilayer polymer resist system on a substrate comprising an electrode. FIG. 1A illustrates a cross section of a substrate following the deposition of a fluoropolymer base layer. Substrate 10, in this embodiment, has deposited thereon an oxide layer 12, bottom electrode 14, and a first layer of a fluoropolymer resist, herein referred to as the fluoropolymer base layer 16. The bottom electrode 14 can be a transparent material such as indium tin oxide (ITO) or a conducting polymer such as, for example, doped polyaniline, a thin layer of a metal, such as Ag, Au or Al, or a combination thereof. Bottom electrode material layer thicknesses can range from, for example, 10-100 nm with an overall bottom electrode material thickness of 100±10 nm. Shown is a single bottom electrode, however it is understood that the organic device may be comprised of a plurality of bottom electrodes which may be unpatterned or patterned, such as into rows or columns or other geometric or regularly spaced arrangement. The optional oxide layer 12 is used to achieve improved adhesion between the substrate 10 and the bottom electrode 14 and can be formed, for example, of a conducting transparent oxide material. Examples of transparent conducting oxide (TCO) materials include, but are not limited to, Indium Tin Oxide (ITO), Indium Zinc Oxide (IZO), and Aluminum Zinc Oxide (AZO). TCOs are electrically conductive materials with a relatively low resistivity and relatively high transmittance. In use of the presently described trilayer system, the fluoropolymer base layer 16 is capable of being etched into a cavity with an undercut for receiving an OLED stack or other organic stack during manufacturing. Although the term 'organic stack' and 'organic layer' are used herein, it is understood that any semiconductor device containing one or more layers of light-sensitive material may benefit from the present photolithography method.

Fluoropolymers of use in the fluoropolymer base layer 16 are generally fluorocarbon-based polymers with multiple carbon-fluorine bonds. Fluoropolymer materials are characterized by a high resistance to solvents, acids, and bases, but can be etched using oxygen plasma or reactive ion etching. Some suitable fluoropolymer base layer materials include amorphous fluoropolymers. Fluoropolymer base layer 16 materials of use in the present system preferably have extremely high transparency (i.e. a visible light transmission ratio of 95% or greater) as optical transparency may be required for alignment during photolithography. One example of a suitable material for the fluoropolymer base layer is CYTOP® produced by AGC Chemicals, which is classified by its unique amorphous structure. CYTOP® can be dissolved with certain fluorinated solvents and can be used in thin film coatings to achieve a sub-micron thickness. Another example of a suitable fluoropolymer for the fluoropolymer base layer 16 is Teflon™ AF1600X (AF). Preferably, the fluoropolymer does not negatively chemically interact with the organic materials of the OLED device, as the process used to lift off the fluoropolymer must not damage any previously deposited OLED stacks or organic layers. Spin coating can be used to apply the fluoropolymer in the present method. In fabrication, spin coating can be used to apply a uniform thin film (420±20 nm) onto a solid surface by applying the film material in a volatile solvent and using centrifugal force to spread the film out onto the surface. The higher the angular speed of spinning, the thinner the film. In a typical spin coating procedure, a liquid is placed at the center of a circular surface and the surface is rapidly rotated to produce uniform films of 1-10 μm in thickness. In one example, the fluoropolymer base layer 16 is applied by spin coating, and spun to a thickness of 340-500 nm at a speed of 4000 RPM for approximately 20-25 seconds. It should be noted that the thickness of the fluoropolymer base layer 16 is preferably 1.25 times the thickness of the organic material later deposited. Following the spinning process, the fluoropolymer base layer 16 is cured. In one example curing process, the first phase (prebaking) is a drying of the fluoropolymer base layer 16 at room temperature for 5-30 minutes, which removes gas bubbles. To further de-gas the fluoropolymer base layer 16, an optional bake at 50° C. for 10-30 minutes removes any remaining bubbles. The next phase is another prebake with a bake at 80-100° C. for 30-60 to remove the remaining solvent in the fluoropolymer base layer 16. The final phase is the final bake, at a temperature of 180-250° C. for 30-60 minutes to improve the adhesion of the fluoropolymer base layer 16 to the substrate 10. Other curing processes of the fluoropolymer base layer may be also used dependent upon the base layer material, to de-gas, remove solvent and improve adhesion of the base material. It should be noted that FIG. 1A illustrates a substrate covered by an oxide layer, however the presence of said oxide layer 12 does not impact the disclosed trilayer resist system and the fluoropolymer base layer 16 can also be deposited directly upon the substrate. It is also noted that although spin coating is provided as an example method of application, other methods of application can be used to apply the fluoropolymer, for example, spray coating or other deposition methods and deposition of the fluoropolymer base layer includes the physical deposition and all processing phases (prebake and final baking steps).

The thickness of the fluoropolymer base layer 16 in the present method is preferably between 100 nm and 2 μm and can be selected based on the thickness of the organic OLED materials to be deposited through the fluoropolymer base layer 16. The thickness of the fluoropolymer base layer 16 should also be sufficient to provide the desired planarization. When considering OLED arrays, the fluoropolymer should use solvents that do not interact or interact very weakly with OLED materials. This is particularly important when patterning a second array of OLED devices on a substrate 10 comprising an OLED device. Preferably, the minimum thickness, or height, of the fluoropolymer base layer should be about 1.25 times the thickness of the organics that will deposited on top of the base layer for liftoff. Designing the fluoropolymer base layer height to be just a bit higher than the deposited stack enables deposition of the stack layers through the trilayer system with enough space to accommodate all layers below the undercut of the fluoropolymer base layer. For example, in an OLED, 1.25× the height of a red organic stack could be 308±30.5 nm, 1.25× the height of a green organic stack is 258±30 (12%) nm, or 1.25× the height of a blue organic stack is 238±35 (15%), suggests a fluoropolymer base layer 16 minimum thicknesses of 385 nm, 322.5 nm, and 297.5 nm respectively. The maximum thickness of the fluoropolymer base layer 16 and overall trilayer resist system stack height may be determined through simulation and/or experimentation. If the layers in the trilayer system are too thick and/or the desired undercut is not adequately formed in the fluoropolymer base layer 16, a shadowing effect may occur. This shadowing effect can result in non-uniform organic layer thicknesses from the sidewall of the fluoropolymer base layer 16 blocking or "shadowing" the active area of the bottom electrode 46, thereby preventing even deposition. In general, the total height of the trilayer resist stack should preferably be minimized as much as possible to universally improve the uniformity of organics deposition and reduce shadowing effects. According to an embodiment of the present disclosure, the height of the fluoropolymer base layer 16 should not exceed 530 nm, assuming that the positive-type resist image layer and inorganic transfer layer are limited to thicknesses of 500 nm and 100 nm respectively. It is also preferred that the actual minimum fluoropolymer base layer 16 thickness should range from 340-400 nm, while maintaining the ratio of 1.25× the height of the organic stack.

FIG. 1A depicts a single bottom electrode 14 on a substrate 10 for illustrative purposes, however it is understood that the substrate 10 may have additional organic or OLED devices and a plurality of electrodes deposited upon it that are not shown in the magnified profile view of FIG. 1A. As the trilayer resist system is removed using liftoff after the deposition of the organic and other layer(s), it is imperative that the liftoff method for the trilayer photoresist system avoids damaging any deposited organic layer or OLED structure or other chemically sensitive structure.

FIG. 1B illustrates a cross section of a substrate following the deposition of an inorganic transfer layer. The substrate 10 shown has layered upon it, in order, an oxide layer 12 and a bottom electrode 14, a fluoropolymer base layer 16, and an inorganic transfer layer 18 deposited directly on the fluoropolymer base layer 16. The inorganic transfer layer 18 is responsible for masking the pattern from the top layer of the trilayer resist system to the fluoropolymer base layer 16. There are a variety of dielectrics and metals that can be used as suitable materials for the intermediate inorganic transfer layer 18. The selectivity of these materials versus the photoresist layer materials to oxygen plasma is strong, which also enables the intermediate inorganic transfer layer 18 to be comparatively thin. Films that are also selective over fluoropolymer films to an oxygen plasma etch would be suitable materials for use in the intermediate inorganic transfer layer 18. These include but are not limited to metals such as aluminum, or dielectrics such as silicon dioxide. The film may be deposited using physical vapor deposition techniques such as evaporation or sputtering, chemical vapor deposition techniques such as plasma enhanced chemical vapor deposition, or a spin coating process. Preferably temperatures involved in the deposition should not exceed about 120° C. to avoid damage to any organic materials.

FIG. 1C illustrates a cross section of an electrode substrate following the deposition of the positive-type photoresist image layer, thereby forming the trilayer resist system. The substrate 10 shown has layered on it, in order, an oxide layer 12, bottom electrode 14, a fluoropolymer base layer 16, an intermediate inorganic transfer layer 18 and a positive-type photoresist top layer, herein referred to as the positive-type photoresist layer 20, deposited directly on the inorganic transfer layer 18. The positive-type photoresist layer 20 is responsible for recording the image of the photomask that is used for lithography. Once patterned with UV light, the positive-type photoresist layer 20 is referred to as the image layer. As previously mentioned, photoresists are categorized as positive or negative-type. Positive photoresists chemically transform and become soluble to etching when exposed to UV light. Therefore, only the exposed regions of the photoresist to light are removed through etching while the unexposed regions of the photoresist remain insoluble. Alternatively, for a negative photoresist, the region of the photoresist that is exposed to UV light or photolithography radiation becomes insoluble to etching. UV light is used herein as an example of radiation that can be used in photolithographic patterning, however it is understood that a range of wavelengths may be used based on the properties of the photoresist layer. Positive photoresists are easier to control during photolithography because they generally maintain their size and can receive a radiation pattern, have better etching resistance, have superior resolution, and have good thermal stability. The photoresist layer can be removed through chemical etching. Chemical etching techniques include but are not limited to use of a developer, plasma etching, reactive ion etching, and ion beam milling.

In the disclosed trilayer resist system, the positive-type photoresist layer 20 needs to be of sufficient thickness to function as a mask for the etch of the inorganic transfer layer 18, which is thin compared to what would be otherwise required in other photolithography systems. The positive-type photoresist layer 20 is also preferably deposited on a planar surface, in this case the planar inorganic transfer layer 18, therefore it is not restricted by a minimum thickness dictated by the topography on which it is deposited. These factors allow the top positive-type photoresist layer 20 to be much thinner than would otherwise be possible for a single layer resist system, thereby enabling a higher resolution pattern to be imaged thereon, resulting in the ability of the present system to deposit higher resolution and smaller organic devices. The positive-type photoresist layer 20 may be deposited using a variety of techniques, for example using a spin coating technique, a sprayed-on technique, or dip application. Spin coating is a preferred method as it allows for finer control during application and a reduced layer thickness. The film for the positive-type photoresist layer 20 can be as thin as 10s of nanometers to several micrometers thick. Baking procedures used during the coating process should be carefully controlled to avoid heat damaging of the organic materials while enabling curing of the positive photoresist. In the present case, a baking temperature limit for the positive photoresist top layer 20 not exceeding 120° C. has been found to be acceptable. It is understood that reference to deposition of the top positive photoresist layer 20 includes the physical deposition of the photoresist as well as all processing phases including drying, curing, degassing, and baking steps.

The material selection criterion for the positive-type photoresist layer 20 should be considered such that the resist material provides strong adhesion to the inorganic transfer layer 18, and the positive-type photoresist layer 20 is sufficiently thin to be completely removed by the oxygen plasma during the fluoropolymer base layer etch step. Suitable materials for the positive-type photoresist layer 20 include but are not limited to commercially available positive-type photoresists compatible with common developers and strippers with suitable film thickness. In an example, the positive photoresist can be formulated from a phenol-formaldehyde novolak resin. Specific examples of suitable positive photoresists are those from the AZ®1500 family of positive photoresists from Micro Chemicals.

Figure 2A:
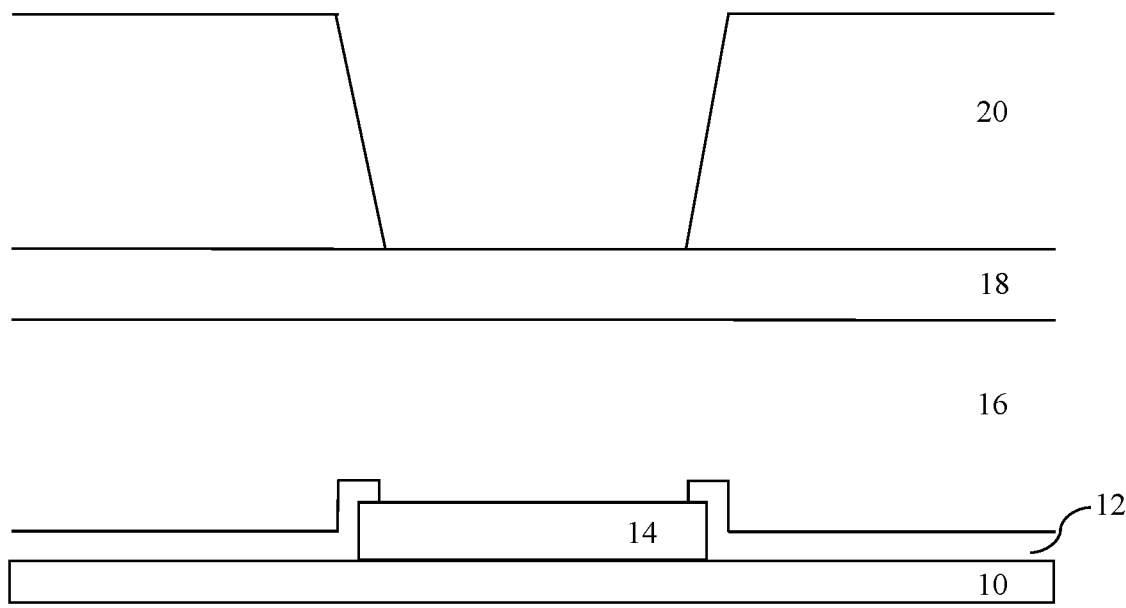
FIG. 2A illustrates a cross section of a substrate with an electrode and a trilayer resist system following photolithography of the positive-type photoresist image layer.

FIGS. 2A-2F illustrate a method of patterning the trilayer photoresist system and deposition of an organic layer on an exposed electrode in accordance with the present method. The organic layer can be an organic stack, or plurality of layers, wherein in at least one layer is comprised of an organic material. FIG. 2A illustrates a cross section of a substrate with an electrode and a trilayer resist system following photolithography of the positive-type photoresist image layer. The substrate 10 shown has layered upon it, in order, an oxide layer 12 and a bottom electrode 14, and the disclosed trilayer resist system comprising a fluoropolymer base layer 16, an inorganic transfer layer 18, and a positive-type photoresist layer 20. A photolithography technique is used to pattern the positive-type photoresist layer 20 to expose the inorganic transfer layer 18 above bottom electrode 14 where the organic layer(s) will be deposited. A photomask can be used to develop the positive-type photoresist layer 20. In an example of patterning, UV light is applied to the positive-type photoresist layer 20 in a desired pattern through a photomask, and the exposed regions of the positive-type photoresist layer 20 underneath the UV-transparent regions of the photomask become soluble to etching. The etching process then removes the soluble regions of the positive-type photoresist layer 20 transferring the desired pattern to the positive-type photoresist layer 20. In this embodiment, etching is performed using a developer that may be comprised of a hydroxide such as, for example, sodium hydroxide (NaOH), potassium hydroxide (KOH), tetramethylammonium hydroxide, or other suitable materials. Developers typically have a limited range of useful dilutions. Highly concentrated dilutions have high sensitivity and allow faster photo speeds, but they are limited by high dark film losses and reduced contrast. The more dilute concentrations enable high contrast and provide greater selectivity between the exposed and unexposed resist. These require longer development times or increased exposure energy and have greater sensitivity to the effects of standing waves from monochromatic exposure. Sodium-based buffered developers provide optimal process control while minimizing the attack on aluminum surfaces. Potassium-based buffered developers provide optimal process control while minimizing contamination risks by using the less mobile potassium ion. In one example process, developers can have about a 1:4 dilution ratio, a development time of about 15-25 seconds and a water rinse time of about 55-65 seconds. The positive-type photoresist layer 20 should be developed with the developer after exposure of UV light through the photomask, taking care that the developer solution does not or only limitedly reacts with the inorganic transfer layer 18. If a post exposure bake process is desired for the positive-type photoresist layer 20 to further remove solvent, the temperature should not exceed a temperature that would destabilize or damage the organic materials, for example 120° C.

Figure 2B:
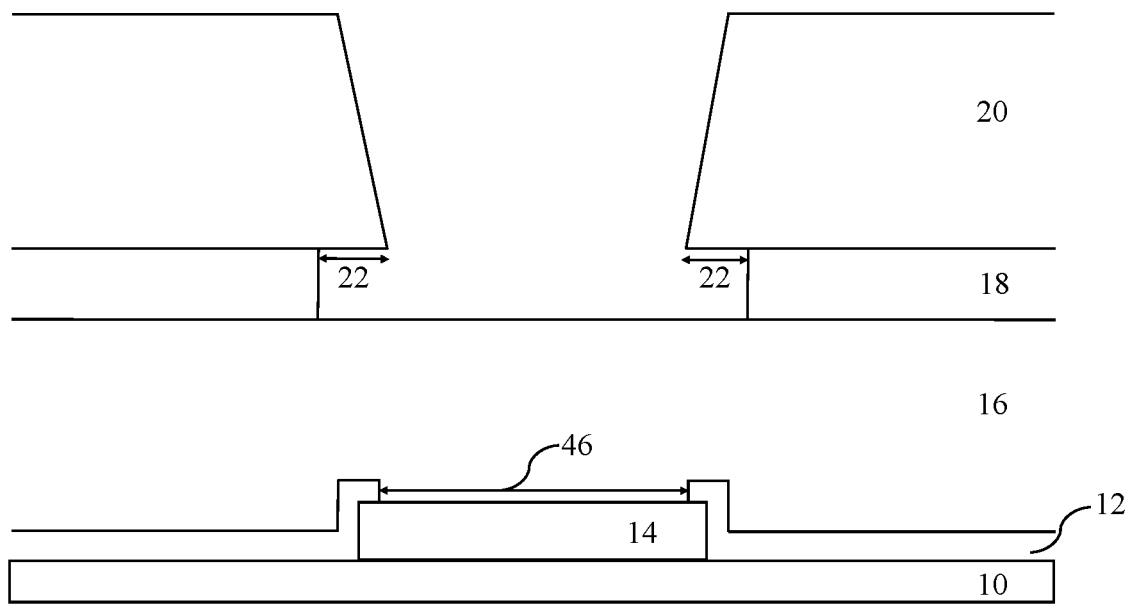
FIG. 2B illustrates a cross section of a substrate with an electrode and a trilayer resist system following etching of the inorganic transfer layer.

FIG. 2B illustrates a cross section of a substrate, an electrode and a trilayer resist system, following etching of the inorganic transfer layer 18. The substrate 10 shown has layered upon it, in order, an oxide layer 12 and bottom electrode 14, and the disclosed trilayer resist system comprising a fluoropolymer base layer 16, an inorganic transfer layer 18, and a positive-type photoresist layer 20. The pattern formed in the top positive-type photoresist layer 20 is transferred to the inorganic transfer layer 18 by a wet etching process. There are a variety of etching techniques, including wet etching which utilizes a chemical etchant, and dry etching which uses a plasma, also referred to as plasma etching. Plasma etching is a processing technique whereby the surface of a source material becomes rougher on a microscopic scale. This is achieved using a reactive gas, such as oxygen, thereby altering both chemical and physical properties of the source material being etched. This chemical effect is imparted by the reactive gas, which steadily reacts and combines with the surface molecules of the material being etched. High energy ions are responsible for the physical effects as they physically hit surface atoms of the source material, thereby moving them to the gas phase. Ideally, the plasma recipe should be at a relatively high pressure and low power so that it is capable of producing an undercut. In this embodiment, the inorganic transfer layer 18 is etched, transferring the pattern formed in the top positive-type photoresist layer 20 to the inorganic transfer layer 18. This transfer should preferably form an undercut region 22. Etching of the inorganic transfer layer 18 using a high pressure and low power recipe will produce the desired undercut region 22. For example, for a fluoropolymer base layer 16 thickness of 340-400 nm and an inorganic transfer layer thickness 18 of 100 nm, about 0.33-0.35 µm of minimum offset or undercut length has been found to prevent shadowing and non-uniform deposition of organic layers over the bottom electrode active area 46. Preferably, the etching plasma and conditions used to remove the inorganic transfer layer 18 under the pattern created by the positive-type photoresist layer 20 are not damaging to the positive-type photoresist layer 20 or the fluoropolymer base layer 16 underneath. Wet or dry etching can be used for etching the inorganic transfer layer 18 of the disclosed trilayer resist system. Preferably, the etching plasma and conditions during a dry etch, or chemical interactions during a wet etch, which are used to remove the inorganic transfer layer 18 in the pattern created by the positive-type photoresist layer 20 are not damaging to the positive-type photoresist layer 20 or the fluoropolymer base layer 16 underneath. Depending on the choice of method for etching the inorganic transfer layer 18, a small undercut 22 may be created which ideally will be minimised during processing.

Figure 2C:
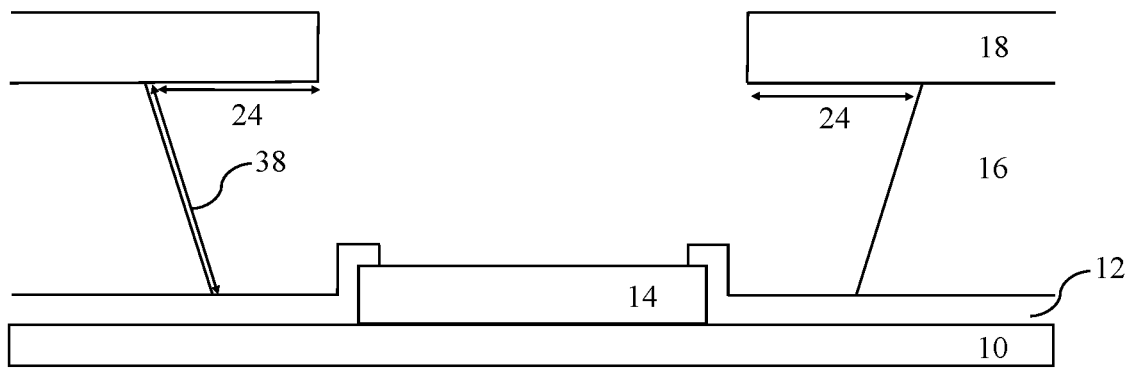
FIG. 2C illustrates a cross section of a substrate with an electrode and a resist system following etching of the fluoropolymer base layer.

FIG. 2C illustrates a cross section of a substrate, an electrode and a resist system, following etching of the fluoropolymer base layer with an oxygen plasma or fluorosolvent. The substrate 10 shown has layered on it, in order, an oxide layer 12 and bottom electrode 14, a fluoropolymer base layer 16 and an inorganic transfer layer 18 following the transfer of the pattern from the inorganic transfer layer 18 to the fluoropolymer base layer 16. The pattern transfer procedure can use, for example, a reactive ion etching (RIE) process, such as an oxygen plasma etch to remove a region of the fluoropolymer base layer 16 to expose bottom electrode 14 which is the electrically active area on which the organic stack or organic layer(s) will be deposited. Ideally, the reactive ion etching will not have a negative impact or cause damage to the underlying oxide layer 12, bottom electrode 14, or substrate 10 used for OLED or organic device operation. Additionally, preferably patterned etching of the fluoropolymer base layer 16 will proceed slightly sideways underneath the remaining inorganic transfer layer 18, to produce a lateral undercut profile 24 and a longitudinal undercut profile 38, ideal for the liftoff procedure. In one example, the lateral undercut profile 24 can be limited to ≥0.25 µm in length. The underlying bottom electrode 14 can also be made accessible through the open pattern in the trilayer resist and can be treated prior to deposition of the organics. The degree of angle for the longitudinal undercut profile relative to the normal of the substrate 10 can vary. In a preferred example the longitudinal undercut profile 38 angle relative to substrate 10 is preferably at least 30 degrees from the lateral undercut profile. Etching the fluoropolymer base layer and creating the undercut can be done, using an etching treatment such as, for example, using UV ozone or an oxygen plasma. The lateral undercut profile 24 and longitudinal undercut profile 38 can be formed using an etching process in a similar way it is formed in the inorganic transfer layer 18. The lateral undercut profile 24 and longitudinal undercut profile 38, which is the minimum offset required to prevent shadowing, and overlay accuracy are all specific to the height of the fluoropolymer base layer 16 and the inorganic transfer layer 18 and change if the organic stack height changes. Generally, expanding the height of the fluoropolymer base layer 16 beyond 530 nm should be avoided unless it is accounted for by expanding the horizontal offset, lowering the sidewall angle, and/or lowering the thickness of the other layers. It has been found that maintaining and minimizing the sidewall angle of the fluoropolymer base layer 16 avoids excessive shadowing resulting from the limiting factor of the top edge over the inorganic transfer layer 18. It is noted that etching of the fluoropolymer base layer 16 above the electrode 14 also substantially removes the remaining positive-type resist image layer 20.

Preferably, the bottom fluoropolymer base layer 16 is etched by oxygen plasma or reactive ion etching (RIE) with reactive plasma to remove material deposited on the substrate. The fluoropolymer base layer 16 should therefore have good selectivity in an oxygen or reactive ion etching process. Etch selectivity can be described as the ratio of etch rates between materials. The formula for etch selectivity is:

$$\text{Selectivity} = \frac{\text{Etch Rate}_{Material\ A}}{\text{Etch Rate}_{Material\ B}}$$

Selective etching describes a process wherein a first material etches more rapidly than a second material. The result is a difference in the quantity of each material that is removed in a specific time period. For example, selective etching to a mask material means the mask is only slightly thinned while the material of interest to be etched has more material removed. Selective etching of a mask allows the mask to be much thinner and increases the ability to achieve a more vertical profile in the etched material. In other examples, consisting of layers of material, it may be useful to selectively etch one material and selectively stop on an underlying material. There are a variety of dielectrics and metals that act as suitable materials for the intermediate inorganic transfer layer 18. The selectivity of these materials versus typical first resist layer materials to oxygen plasma is strong, which also enables this layer to be comparatively thin. In optical lithography, another consideration is alignment of the mask pattern to features on the substrate 10. This intermediate inorganic transfer layer 18 can be as thin as 10s of nanometers to 100s of nanometers thick. Examples of films that can be used include metals such as aluminum, chromium, or dielectrics such as silicon dioxide. It should be noted that any film that is highly selective over fluoropolymer films to an oxygen plasma etch would be suitable. The film may be deposited using physical vapor deposition techniques such as evaporation or sputtering, chemical vapor deposition techniques such as plasma enhanced chemical vapor deposition, or a spin coating process. Preferably temperatures involved in the deposition should not exceed about 120° C. to avoid damage to any organic materials. It is generally preferable that the inorganic transfer layer 18 is transparent to the wavelength of light used for alignment. The inorganic transfer layer 18 ideally has good selectivity to oxygen plasma as an oxygen plasma etching process is performed to transfer the pattern from the inorganic transfer layer 18 to the fluoropolymer base layer 16. A transparent or semi-transparent material selection would be beneficial for alignment purposes, therefore $SiO_2$ is also a candidate for the inorganic transfer layer material. One consideration is that the $SiO_2$ be low stress in order to sustain the deposition of the top positive-type photoresist image layer.

Figure 2D:
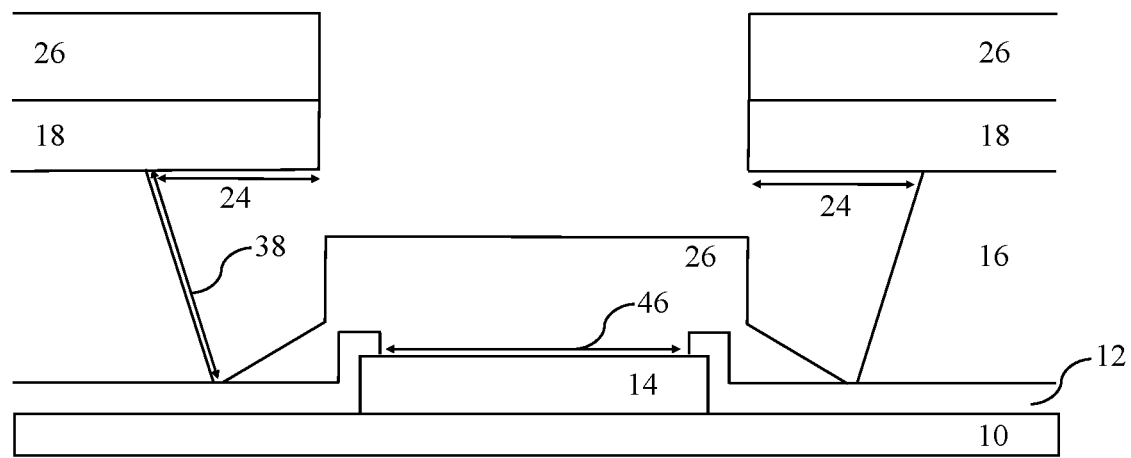
FIG. 2D illustrates a cross section of a substrate with an electrode and a resist system following the deposition of an organic stack.

FIG. 2D illustrates a cross section of a substrate with an electrode and a resist system following the deposition of an organic stack. The substrate 10 shown has layered on it, in order, an oxide layer 12 and bottom electrode 14, a fluoropolymer base layer 16 with a lateral undercut profile 24 and a longitudinal undercut profile 38, and an inorganic transfer layer 18 following the transfer of the pattern from the inorganic transfer layer 18 to the fluoropolymer base layer 16. FIG. 2D further illustrates an embodiment of the present disclosure following the deposition of the organic stack 26 on top of the active area 46 of bottom electrode 14. In this embodiment, the organic stack 26 comprises at least one layer of organic material suitable for creating an OLED device. In alternative embodiments of an organic device, the organic stack 26 may be a single organic layer. In one example, the layers of the organic stack 26 are deposited using thermal evaporation deposition. Evaporation deposition may be defined as a method of thin-film deposition wherein the source material is evaporated in a vacuum. The vacuum allows vapor particles to travel directly to the target object (substrate 10), where they condense back to a solid state.

A shadow mask can be used for evaporation deposition, wherein the evaporation gas travels through the opening in the shadow mask onto the bottom electrode 14, such that an organic stack 26, corresponding to the width of the lower portion of the opening is formed on the bottom electrode 14. This can prevent the generation of shadow effect or reducing the widths of the inner and outer shadows of the organic stack 26 during evaporation. Shadow masks are generally micro-structures, or stencils, that are used to define device areas, with precision, for deposition, etching, or a variety of applications suitable for processing a substrate. Precision is particularly important when depositing the organic stack 26 on the bottom electrode 14 to avoid shadowing effects. Shadowing effects may result in the organic stack 26 not fully covering the active area of the bottom electrode 46, resulting in decreased performance and edge effects on the perimeter of the bottom electrode active area 46 due to a reduced thickness of the organic stack 26 layers at that perimeter. This can further result in non-optimal electrical properties and optical characteristics in an OLED device. Shadowing effects can be reduced by using a shadow mask for precise deposition and by forming a lateral undercut profile 24 and a longitudinal undercut profile 38 in the fluoropolymer base layer during etching. The lateral undercut profile 24 and a longitudinal undercut profile 38 allows the organic stack 26 to be deposited on a defined device area that extends the width of the bottom electrode active area 46. The thickness of the organic stack 26 is preferably less than the thickness of the fluoropolymer base layer 16 in order to form the optimal lateral undercut profile 24 and a longitudinal undercut profile 38 in the fluoropolymer base layer 16.

For an OLED device, the organic layers of the organic stack 26 may include, but are not limited to, one or more electron transport layers (ETL), emission layers (EML), hole transport layers (HTL), and hole injection layers (HIL). The organic device created in part by the organic stack 26 comprising at least a single organic layer, deposited on bottom electrode 14 can also be a microcavity OLED (MCOLED) device. A microcavity organic light emitting diode (MCOLED) is a device in which the materials of an OLED are bound in a microcavity defined by two reflective surfaces arranged in such a way to reflect light within a specific range, or some combination of dielectric and metallic materials. In an MCOLED device the organic materials which make up the organic stack 26 are arranged with material thicknesses $d_j$ which have an optical path length of $L_j$, where $L_j = n_j \times d_j$, and where $n_j$ is the refractive index of the OLED material. The sum of the optical path length of the materials between the reflective surfaces is designed to equal $$\frac{m\lambda_i}{2},$$

where $\lambda_i$ is the peak design wavelength of the MCOLED. The optical path length in the MCOLED can be changed by changing the thickness of one or more of the materials between the reflective surfaces, or by adding one or more additional filler material layers. The use of a microcavity in an OLED structure decreases the spectral width of the OLED, decreases the angular output, and increases the overall efficiency.

Figure 2E:
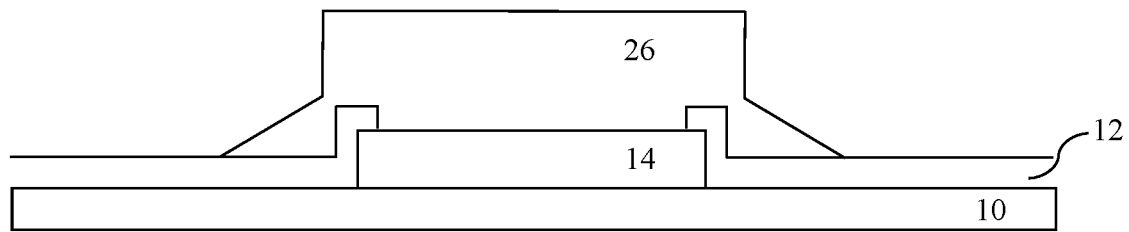
FIG. 2E illustrates a cross section of a substrate with an electrode and an organic stack following the liftoff procedure.

FIG. 2E illustrates a cross section of a substrate with an electrode and an organic stack following a liftoff procedure to remove the trilayer resist system. The organic stack 26 is shown deposited on a bottom electrode 14 and oxide layer 12 on a substrate 10 following the liftoff procedure. Liftoff of the fluoropolymer base layer, remaining inorganic transfer layer, and photoresist image layer is achieved by immersing the substrate 10 and its subsequent layers in a fluorinated solvent, or fluorosolvent, that interacts and dissolves the fluoropolymer base layer, but does not interact with, or interacts very weakly with, the materials of the organic stack 26. After liftoff, the organic stack 26 materials remain on the substrate 10 in the desired pattern. Due to low surface tension, fluorosolvents (also referred to as fluorinated solvents) can penetrate the surface of the fluoropolymer base layer 16 while remaining gentle on the substrate 10 surface. Fluorosolvents are not harmful to the organic stack 26, making the fluoropolymer base layer, and its compatible fluorosolvent, ideal for liftoff of the fluoropolymer base layer of the trilayer resist system following deposition of the organic stack 26. Examples of fluorinated solvents that can be used in the liftoff procedure include but are not limited to 92-97% 1,1,2,2-tetrafluoroethyl-2,2,2-trifluoroethyl ether/3-8% Ethanol, 100% 1,1,2,2-tetrafluoroethyl-2,2,2-trifluoroethyl ether, 46-54% Trans-1,2-dichloroethylene/43-52% 1,1,2,2-tetrafluoroethyl-2,2,2-trifluoroethyl ether, and 46-55% Trans-1,2-dichloroethylene/43-52% 1,1,2,2-tetrafluoroethyl-2,2,2-trifluoroethyl ether/1-3% Ethanol.

Figure 2F:
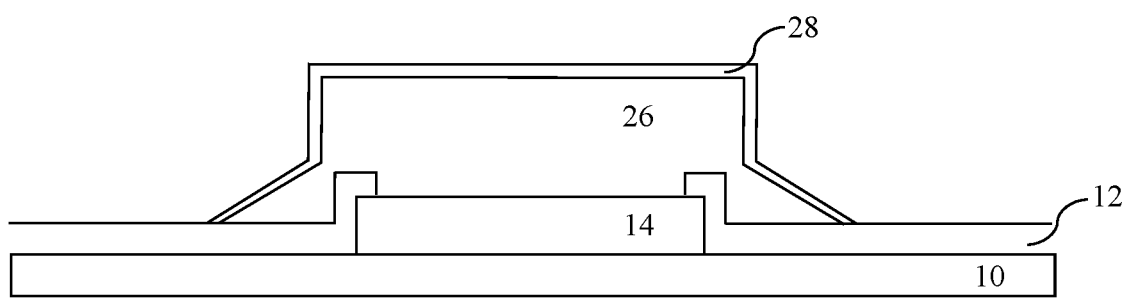
FIG. 2F illustrates a cross section of a substrate with an electrode, an organic stack and a cathode deposited thereon.

FIG. 2F illustrates a cross section of a substrate with an electrode, an organic stack and a cathode deposited thereon. The organic stack 26 is deposited on top of a bottom electrode 14 and oxide layer 12 on a substrate 10 and further illustrates the top electrode 28 following deposition. It should be noted that in this configuration, the top electrode 28 is a cathode and the bottom electrode 14 is an anode, which results in a direct OLED device. It is understood that the electrodes can also be inverted and the disclosed trilayer resist system can also be used with both direct and inverted OLED configurations. If the OLED device were inverted, the bottom electrode 14 would be a cathode and the top electrode 28 would be an anode. The top electrode 28 can be a transparent material such as indium tin oxide (ITO) or a conducting polymer such as, for example, doped polyaniline, or a thin layer of a metal, such as Ag, Au or Al, or a combination thereof and can be deposited by thermal evaporation deposition.

Figure 3:
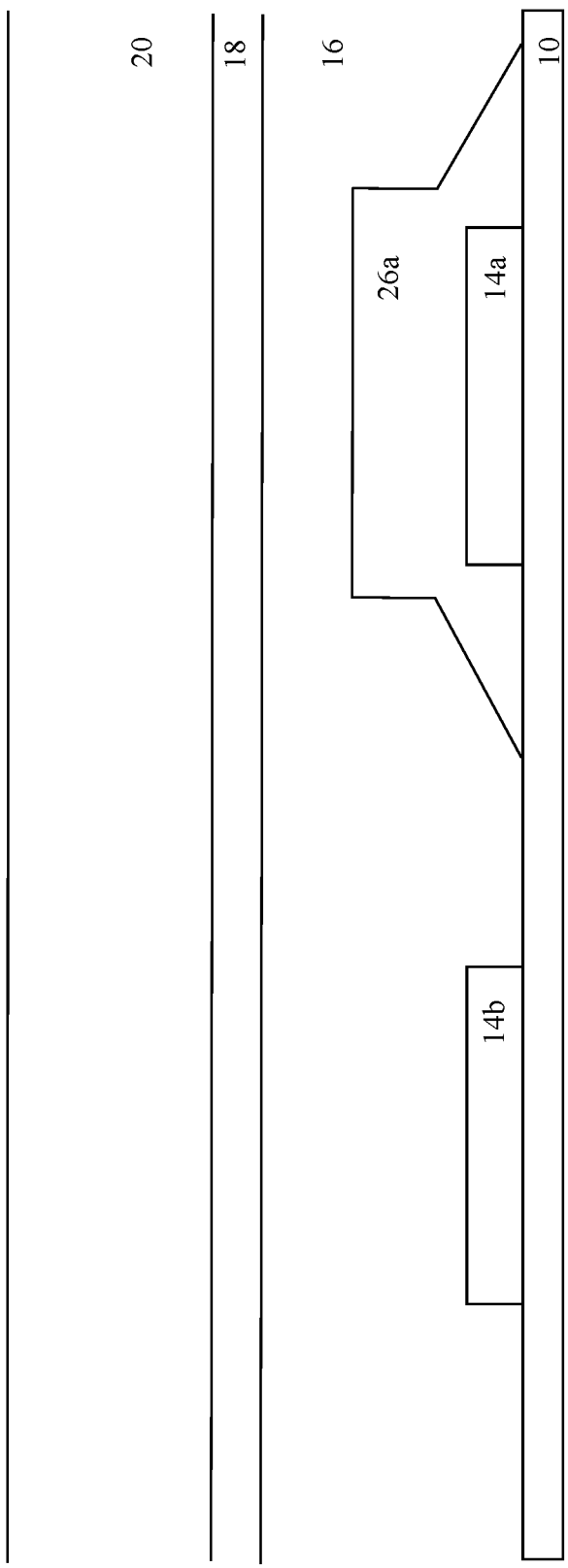
FIG. 3 illustrates a cross section of the disclosed trilayer resist system on a substrate with a first color OLED structure deposited thereon.

FIG. 3 illustrates a cross section of the disclosed trilayer resist system on a substrate 10 with a first bottom electrode 14a and first color OLED organic stack 26a deposited thereon. In the construction of a multi-color OLED array having multiple colors of OLED organic stacks, each color of organic stack can be layered onto a different series or set of bottom electrodes on the substrate. The disclosed trilayer system as has a three-layer structure with a fluoropolymer base layer 16, an inorganic transfer layer 18, and a positive-type photoresist layer 20. As shown, the substrate 10 has deposited thereon a plurality of bottom electrodes. In the first color application, first bottom electrodes 14a are exposed through the trilayer resist system, on top of which a first color OLED organic stack 26a is deposited and the remaining trilayer resist is removed using a fluorosolvent. To prepare the substrate and array for a second, or more, color OLED, the first color OLED organic stack 26a, exposed substrate 10, and other bottom electrodes (an example of which is 14b) are covered completely in a second trilayer resist system comprising a fluoropolymer base layer 16, an inorganic transfer layer 18, and a positive-type photoresist layer 20. The pattern for a second, or successive, color is then applied to the positive-type photoresist layer 20 to expose the inorganic transfer layer 18 for patterning a second color OLED organic stack on a second or successive bottom electrode 14b as previously described. It is noted that while a single bottom electrode for the first and second color OLED devices (14a and 14b respectively) are illustrated in FIG. 3, it is understood that an embodiment of this method would include a series or plurality of bottom electrodes 14a and a series or plurality of bottom electrodes 14b.

Figure 4:
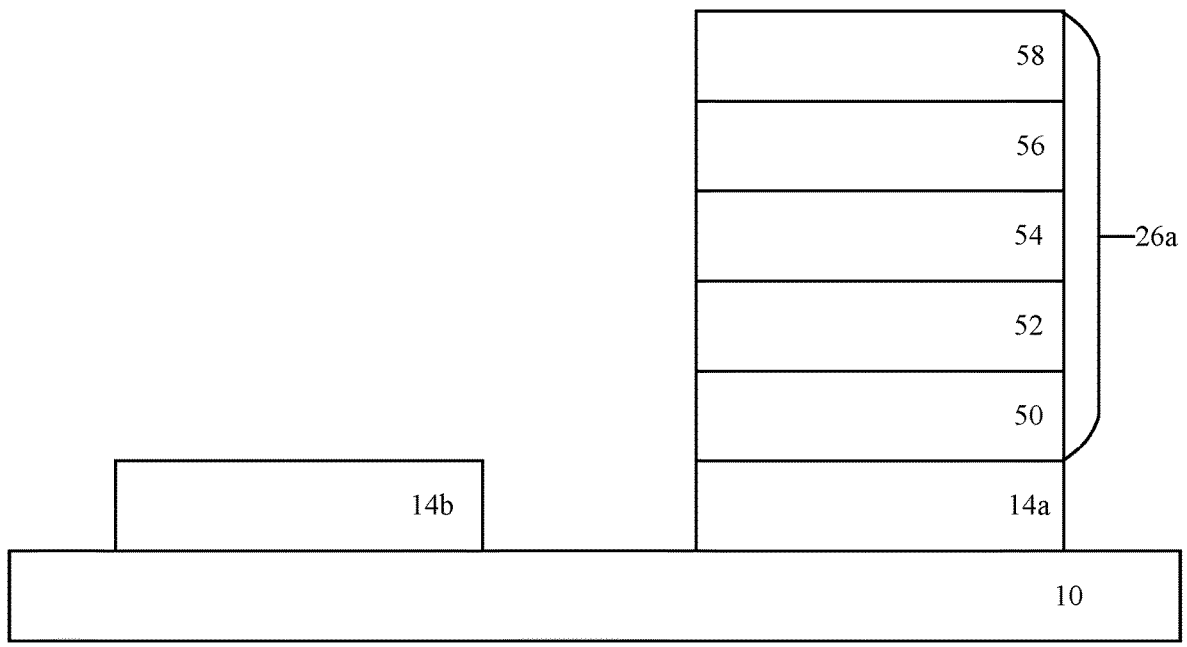
FIG. 4 illustrates a cross section of a substrate having an electrode with an OLED stack deposited on a first electrode and a second electrode without an OLED stack with a trilayer resist system deposited thereon.

FIG. 4 illustrates a cross section of a substrate having an OLED device comprising an electrode with an OLED stack deposited on a first electrode and a second electrode 14b without an OLED stack. In this embodiment, the OLED stack 26a is deposited on a first bottom electrode 14a, positioned on top of a substrate 10 and comprises one or more of each of the following layers: an Hole-Injection Layer (HIL) 50, an Hole-Transporting Layer (HTL) 52, an Emissive Layer (EML) 54, an Electron-Transporting Layer (ETL) 56, and an Electron-Injection Layer (EIL) 58. In addition to the Emissive Layer 54, one or more of the Hole-Injection Layer (HIL) 50, Hole-Transporting Layer (HTL) 52, Electron-Transporting Layer (ETL) 56, and Electron-Injection Layer (EIL) 58 can also be comprised of an organic material or molecule and be considered an organic layer. The electron transport layer (ETL) 56 can be any substantially transparent material that can facilitate electron transport from the relevant electrode to the emissive layer. Examples of materials that can be used for the ETL 56 include but are not limited to 2-(4-biphenyl)-5-phenyl-1,3,4-oxadiazole (PBD), butyl PBD, and PBD or butyl PBD doped in an inert polymer such as poly(methyl methacrylate) (PMMA) or a poly(carbonate). The emissive layer is comprised of organic molecules or polymers that receive electrons from an electrode layer through the Hole-Injection Layer (HIL) 50. The Emissive layer (EML) is an organic layer that 54 comprises one or more organic materials that can include but is not limited to Alq (Tris(8-hydroxyquinolinato)aluminum), aromatic hydrocarbons, poly(phenylene vinylenes), oxadiazole and stilbene derivatives. The EML 54 material can optionally comprise a stable non-emissive host primary component material doped with an emissive material which has an energy gap that is less than that of the primary component material of the EML 54. The hole transport layer (HTL) 52 can be any substantially transparent material that can facilitate the transport of holes to the EML layer 54, where electron-hole recombination takes place. Examples of suitable materials for the HTL 52 can include but are not limited to organic materials such as diamines (e.g., N, N'-diphenyl-N,N'-bis (3-methylphenyl)-1,1'-biphenyl-4,4'-diamine) and poly(phenylene vinylenes). Fluoropolymer base layer 16, intermediate inorganic transfer layer 18, and positive-type photoresist layer 20 are shown deposited on top of the OLED stack 26a as well as second electrode 14b. The device configuration shown is mid-fabrication and ready for a second photolithography and etching sequence to expose second electrode 14b for deposition of a second OLED stack.

For fabrication of the trilayer system, in one example, a CYTOP® fluoropolymer base layer was diluted with CT-Solve180 and any bubbles due to stirring were removed using a vacuum chamber. The base layer was applied to the substrate using a spin-coating technique to achieve ~420±20 nm film. The thickness of the base layer was measured using a Filmetrics measurement tool. The fluoropolymer base layer was then baked for 15 minutes at room temperature, followed by a subsequent bake for 30 minutes at 105° C. The inorganic transfer layer was then deposited on top of the CYTOP base layer at room temperature, with a thickness of 50-100 nm, using magnetron sputtering. The substrate, base layer and inorganic transfer layer were then spin coated with positive resist of AZ®1505 (positive-type resist image layer) at a thickness of 500-600 nm, therefore completing deposition of the trilayer resist system. The resist was then baked at 100° C. for 2 min and rehydrated for 5 min. The trilayer system was subsequently exposed to UV light using direct write lithography and then developed using an AZ® 400K developer.

Figure 5A:
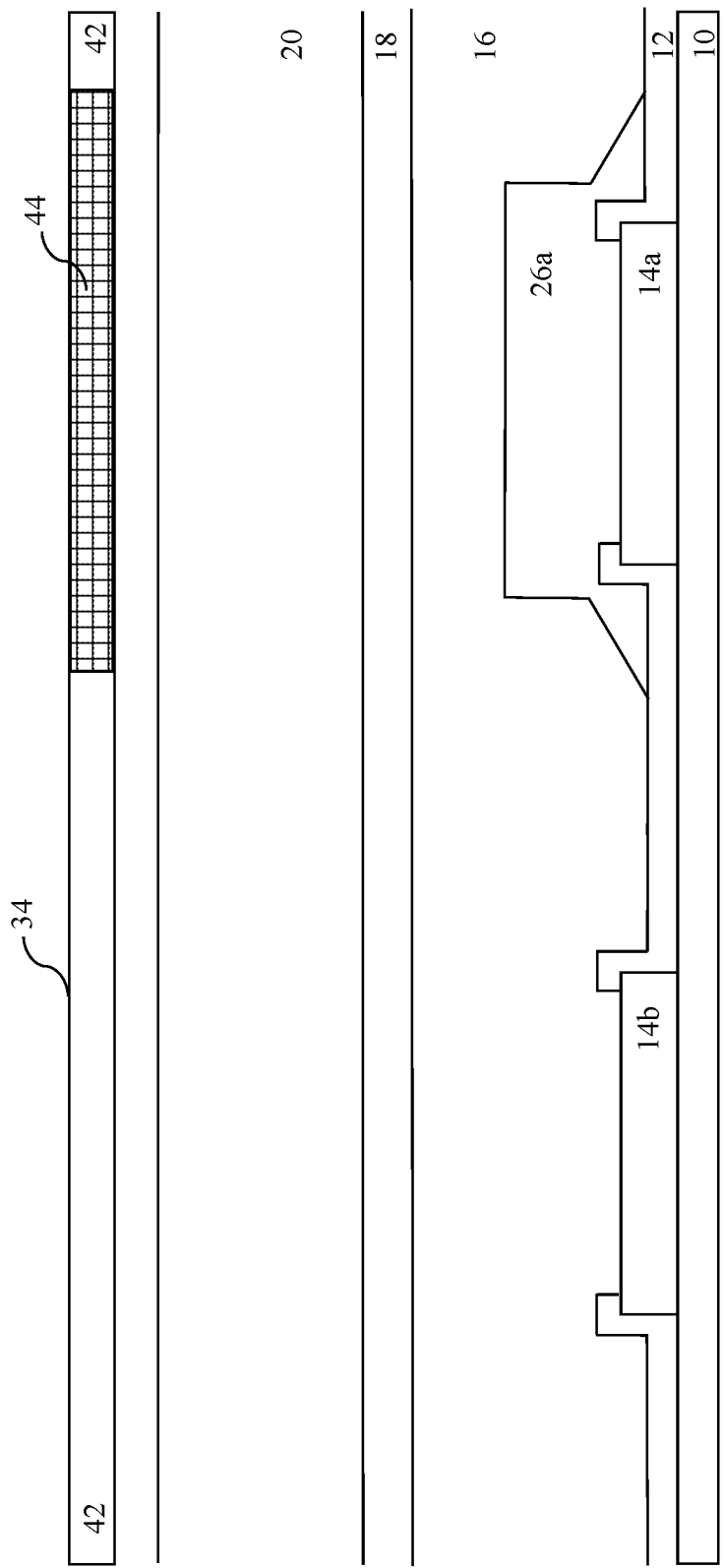
FIG. 5A illustrates a cross section of the UV exposure stage of photolithography for patterning a second color OLED using the disclosed trilayer resist system on a substrate with a first color OLED structure deposited thereon.

FIG. 5A illustrates a cross section of the UV exposure stage of photolithography for patterning a second color OLED using the disclosed trilayer resist system on a substrate with a first color OLED structure already deposited thereon. Substrate 10 shown has deposited thereon, in order, an optional oxide layer 12, a first color OLED organic stack 26a on a first bottom electrode 14a, and a trilayer resist system comprising a fluoropolymer base layer 16, an inorganic transfer layer 18, and a positive-type photoresist layer 20. The trilayer resist system is then used for patterning a second color OLED organic stack on a second bottom electrode 14b. In the trilayer resist system, the positive-type photoresist layer 20 is patterned using a photolithography process. The photomask 34 has transparent regions 42 where UV light rays can penetrate and opaque regions 44 which block UV light from reaching the positive-type photoresist layer 20. The transparent region 42 of the photomask 34 allows UV light rays to penetrate through to the underlying positive-type photoresist layer 20 material. Conversely, the opaque region 44 of photomask 34 prevents UV light rays from penetrating through to the material under the photomask 34, protecting the organic stack 26a underneath and exposing only the area above the electrodes on top of which the second color organic stack should be deposited. In the case of the disclosed trilayer resist system, the opaque region 44 of the photomask 34 covers the material above the first color OLED organic stack 26a. The positive-type photoresist is a type of photoresist in which the region of the photoresist that is exposed to light becomes soluble to the photoresist developer after the positive resist in the positive-type photoresist layer 20 is degraded by ultraviolet light. Generally, the UV light preferably has a wavelength of 100-450 nm, more preferably 300-450 nm. The unexposed region of the positive-type photoresist under the opaque region 44 of the photomask 34 remains insoluble to the photoresist developer. Positive photoresists are well known in the art and highly controllable, however, traditionally have not been able to be used when patterning organic devices due to the damaging nature of their developers to organic materials. In the present case, the developer used to dissolve the part of the positive-type photoresist exposed to UV light does not penetrate the inorganic transfer layer 18, thus protecting the organic stack underneath. Negative photoresists are not commonly used as the resolution is limited due to swelling in the exposed crosslinked areas caused by solvent uptake. Use of a positive photoresist in a trilayer resist system can benefit from the positive photoresist's etching resistance, superior resolution, and thermal stability. A further advantage of the implementation of a positive-type photoresist with a photomask in the present trilayer system, is that the first color OLED organic stack 26a is protected from UV exposure when patterning the second color OLED structure. During development of the positive-type photoresist layer 20 the inorganic transfer layer 18 acts as a barrier layer, protecting the organic stack 26a from the developer, which is very harmful to organic materials. The trilayer resist system is particularly advantageous for patterning multiple organic devices, specifically, multi-color OLED arrays, on a single substrate 10. This is achieved by patterning an array of OLEDs for a first color, then subsequently patterning a second and then third color, if desired, with the photomask exposing only those bottom electrodes desired for organic stack deposition.

Figure 5B:
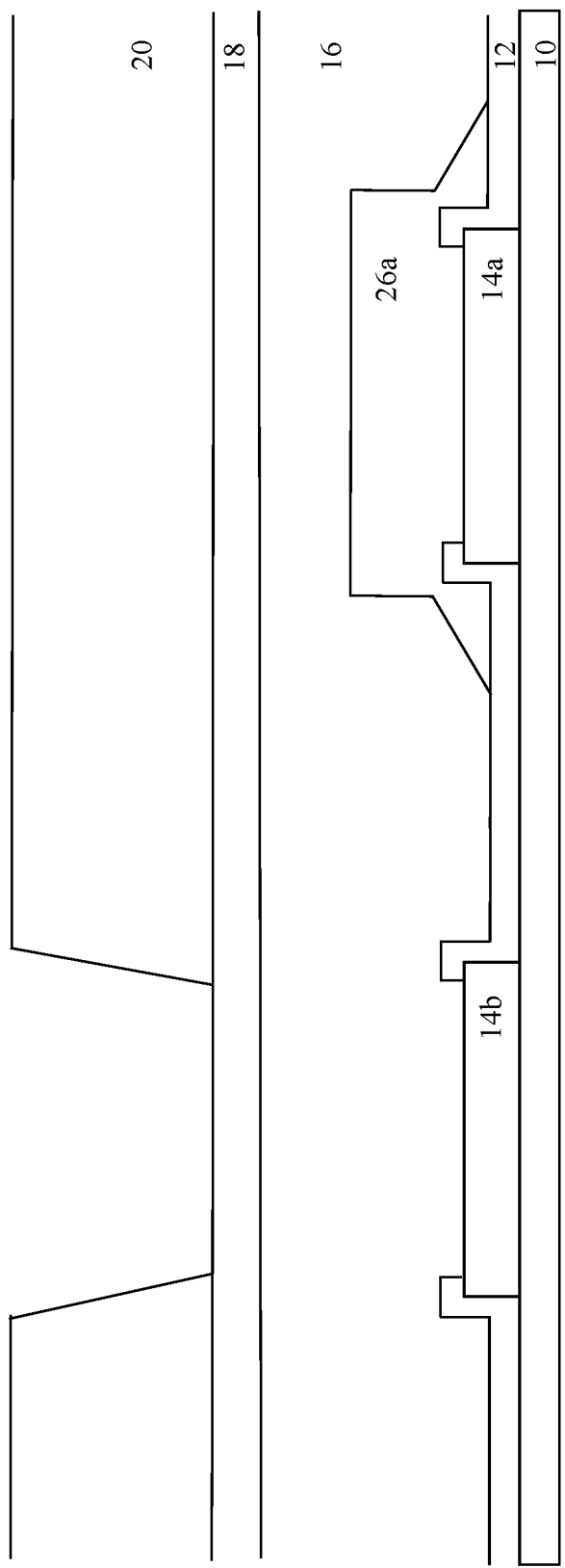
FIG. 5B illustrates a cross section of a substrate with a first color organic stack patterned on a first electrode, a second electrode and a trilayer resist system following patterning of the positive-type photoresist image layer.

FIG. 5B illustrates a cross section of a substrate with a first color organic stack patterned on a first electrode, a second electrode and a trilayer resist system following patterning of the positive-type photoresist image layer. An existing first color OLED structure comprising a first color organic stack 26a is already formed on a first bottom electrode 14a, and the second color is being formed on a second bottom electrode 14b on the same substrate 10. The trilayer system having a fluoropolymer base layer 16, an inorganic transfer layer 18, and a positive-type photoresist layer 20 are covering the substrate and electrodes and organic stacks thereon. In the next step of the patterning process for a second color OLED the desired pattern has been transferred to the positive-type photoresist layer 20 using a photomask and then developed using a developer. The inorganic transfer layer 18 acts as a barrier, protecting the organic stack 26a from the developer. If a post exposure bake process is required to remove excess solvent, the temperature should not exceed a temperature that can potentially damage the organic layers in the organic stack 26a.

Figure 5C:
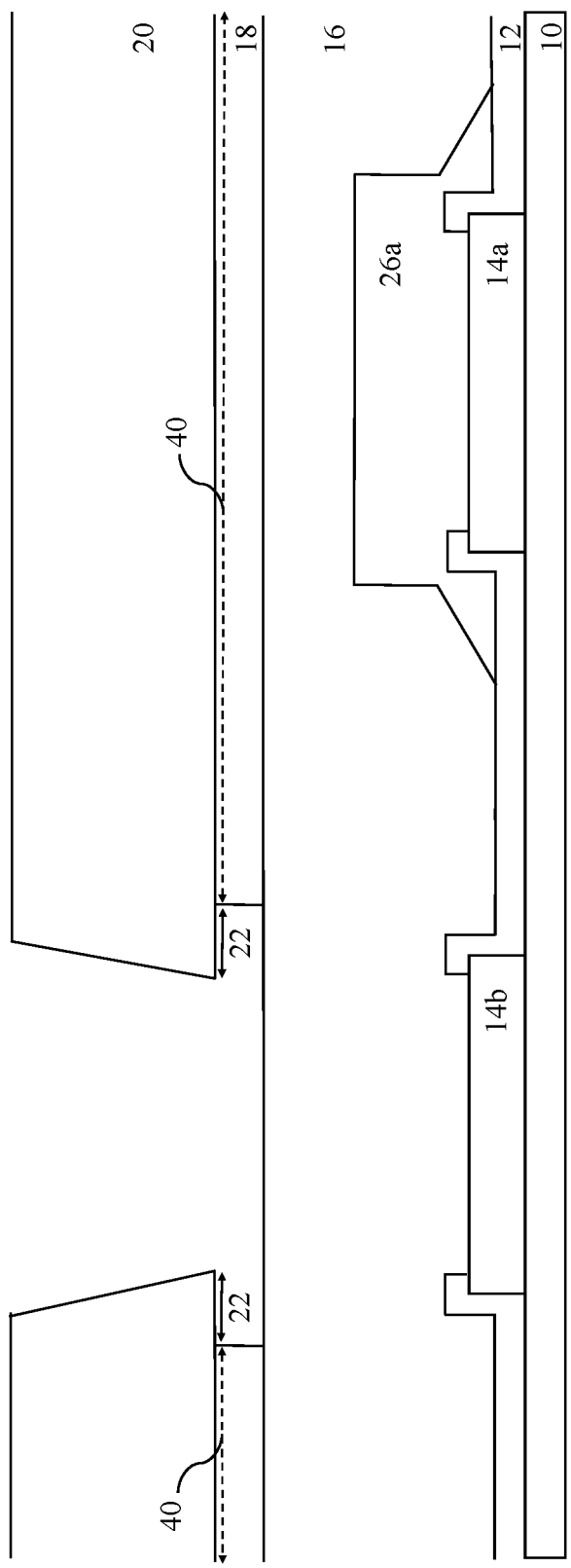
FIG. 5C illustrates a cross section of a substrate with a first color organic stack patterned on a first electrode, a second electrode with a trilayer resist system following etching of the inorganic transfer layer.

FIG. 5C illustrates a cross section of a substrate with a first color organic stack patterned on a first electrode, a second electrode with a trilayer resist system following etching of the inorganic transfer layer. The substrate 10 has on it an oxide layer 12, an existing first color OLED structure comprising a first color organic stack 26a formed on a first bottom electrode 14a, a second bottom electrode 14b on the same substrate 10, and the trilayer system having a fluoropolymer base layer 16, an inorganic transfer layer 18, and a positive-type photoresist layer 20. In a next step of the process for patterning a second color OLED the pattern formed in the positive-type photoresist layer 20 is then transferred to the inorganic transfer layer 18 using a first transfer procedure through the opening in the positive-type photoresist layer 20. The transfer procedure to etch the inorganic transfer layer 18 under the opening in the positive-type photoresist layer 20 can be, but is not limited to, a wet chemical etch or a dry etching technique such as a reactive ion etching (RIE) technique. The first transfer procedure will result in patterning the inorganic transfer layer 18 such that an undercut region 22 is formed, leaving a remaining unpatterned region 40 of the inorganic transfer layer 18. The undercut region 22 can be formed through the controlled etch of the inorganic transfer layer 18 to replicate the pattern formed in the positive-type resist image layer 20 using photolithography, then allowing additional etching time to form the desired undercut 22. Preferably the etch selectivity of the positive-type resist image layer 20 to inorganic transfer layer 18 is between about 0.78-0.82.

Figure 5D:
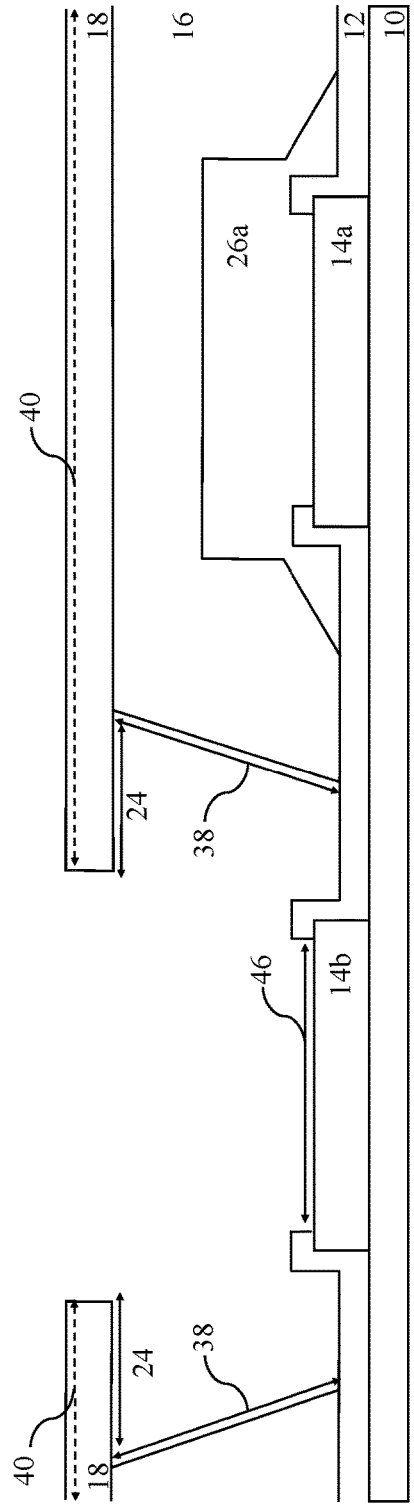
FIG. 5D illustrates a cross section of a substrate with a first color organic stack patterned on a first electrode, a second electrode with a resist system following etching of the fluoropolymer base layer.

FIG. 5D illustrates a cross section of a substrate with a first color organic stack patterned on a first electrode, a second electrode with a resist system following etching of the fluoropolymer base layer. Substrate 10 has an optional oxide layer 12, an existing first color OLED structure comprising a first color organic stack 26a formed on a first bottom electrode 14a, a second bottom electrode 14b on the same substrate 10, and the remaining layers of the trilayer resist system, namely the inorganic transfer layer 18 and the fluoropolymer base layer 16. In patterning a second color OLED, the pattern is transferred from the inorganic transfer layer 18 to the fluoropolymer base layer 16 using a second transfer procedure, which may be, but is not limited to a reactive ion etching (RIE) procedure, such as an oxygen plasma etching procedure. The second transfer procedure results in patterning the fluoropolymer base layer 16 such that a lateral undercut profile 24 and a longitudinal undercut profile 38 are formed, leaving a remaining unpatterned region 40 of the inorganic transfer layer. The offset value determines the lateral undercut 24. For example, for 340-400 nm of fluoropolymer base layer 16 thickness and 100 nm of inorganic transfer layer 18 thickness, about 0.33-0.35 μm of minimum offset is desired to prevent shadowing and non-uniform deposition of an organic stack over the bottom electrode active area 46b. The remaining positive-type photoresist image layer is removed by the development process that etches the fluoropolymer base layer 16 from FIG. 5C has been removed and a patterned opening in the trilayer resist system has been formed.

Figure 5E:
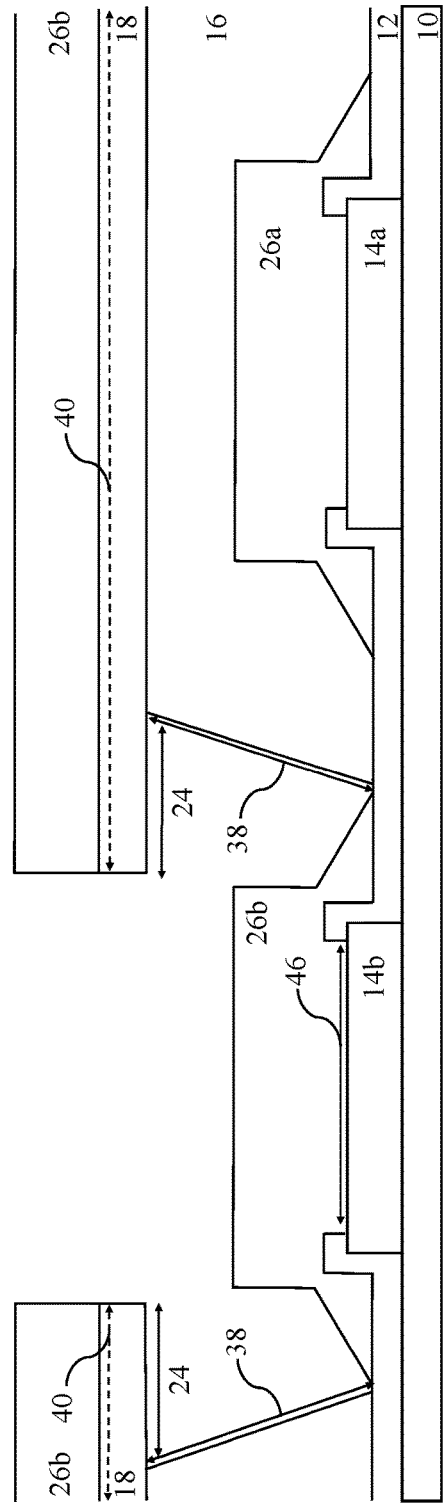
FIG. 5E illustrates a cross section of a substrate with a first color organic stack patterned on a first electrode, a second electrode with a second organic stack deposited thereon following the thermal evaporation of the second organic stack.

FIG. 5E illustrates a cross section of a substrate with a first color organic stack patterned on a first electrode, a second electrode with a second organic stack deposited thereon following the thermal evaporation of the second organic stack. The substrate 10 has an optional oxide layer 12 deposited thereon and a first color OLED structure comprising a bottom electrode 14a and a first color organic stack 26a, and above it a protective fluoropolymer base layer 16 and inorganic transfer layer 18 under the unpatterned region 40. In patterning a second color OLED device using the trilayer resist system a second color organic stack 26b is deposited through the patterning openings in the inorganic transfer layer 18 and the fluoropolymer base layer 16, on top of the second color bottom electrode 14b. The lateral undercut profile 24 and the longitudinal undercut profile 38 of the fluoropolymer base layer 16 allow for the organics to be deposited using evaporation deposition. In one example, the second color organic stack 26b is deposited by thermal evaporation from a point source. A shadow mask can be used for evaporation deposition, wherein the evaporation gas travels through the opening in the shadow mask onto the bottom electrode 14b such that an organic stack 26b, corresponding to the width of the lower portion of the opening, is formed on the bottom electrode 14b. This process prevents the generation of shadow effect or reducing of the widths of the inner and outer shadows of the organic stack 26b during evaporation. Shadow masks are generally micro-structures, or stencils, that are used to define device areas, with precision, for deposition, etching, or a variety of applications suitable for processing a substrate. Precision is particularly important when depositing the organic stack 26b on the bottom electrode 14b to avoid shadowing effects. Shadowing effects may result in the organic stack 26b not fully covering the bottom electrode active area 46, which can result in decreased performance and edge effects on the perimeter of the bottom electrode active area 46 due to a reduced thickness of the organic stack 26b layers at that perimeter. This may further result in non-optimal electrical properties and optical characteristics of the OLED device. Shadowing effects can be reduced by using a shadow mask for precise deposition and by forming a lateral undercut profile 24 and a longitudinal undercut profile 38 in the fluoropolymer base layer. The lateral undercut profile 24 and a longitudinal undercut profile 38 allows the organic stack 26 to be deposited on a defined device area that extends the width of the bottom electrode active area 46.

Figure 5F:
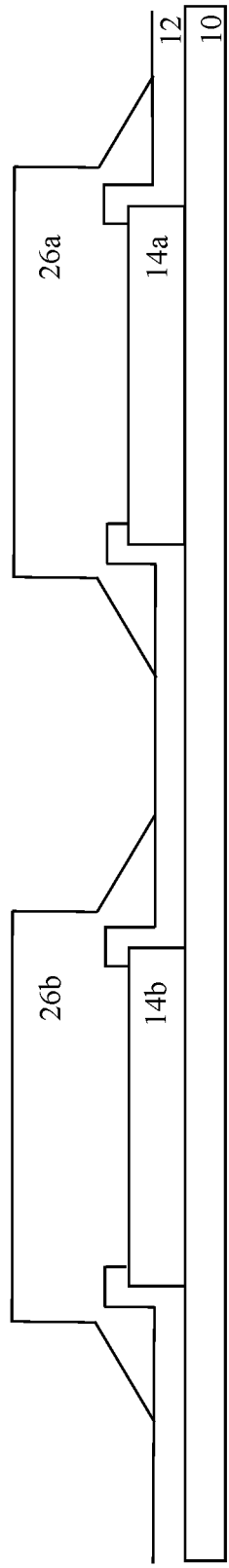
FIG. 5F illustrates a cross section of a substrate with a first color organic stack patterned on a first electrode and a second electrode with second organic stack following the liftoff procedure.

FIG. 5F illustrates a cross section of a substrate with a first color organic stack patterned on a first electrode and a second electrode with second organic stack following the liftoff procedure. To remove the remaining layers of the trilayer resist system, specifically the fluoropolymer base layer, inorganic transfer layer, and the organic stack formed on top of the inorganic transfer layer, a liftoff procedure is performed, and the resulting two-color organic stack array is as shown. Liftoff is achieved by immersing the substrate 10 in a solvent that interacts and dissolves the fluoropolymer base layer but does not interact, or interacts very weakly with the organic stacks 26a, 26b. The OLED materials of the organic stacks 26a, 26b will be left on the substrate 10 together with the oxide layer 12 in the desired pattern following liftoff.

Figure 5G:
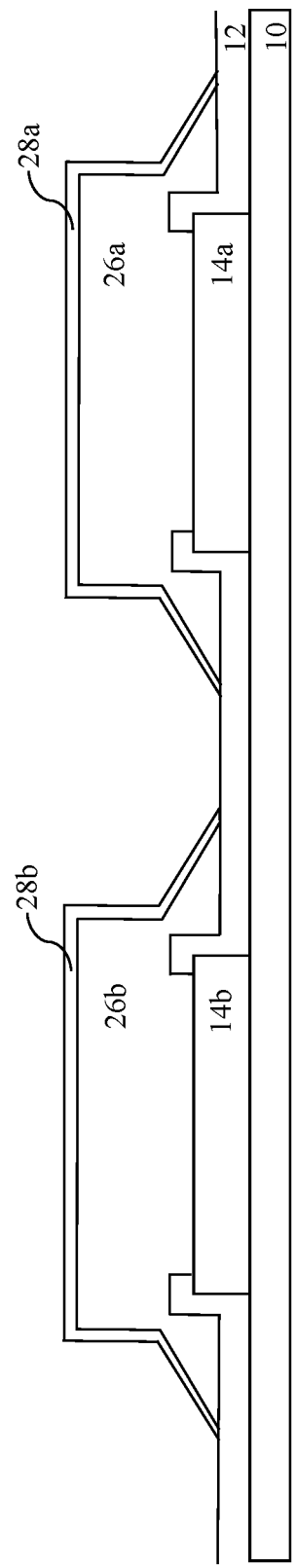
FIG. 5G illustrates a cross section of a multi-colored OLED array on a substrate comprising a first color OLED patterned on a first electrode and a second color OLED patterned on a second electrode.

FIG. 5G illustrates a cross section of a multi-colored OLED array on a substrate comprising a first color OLED patterned on a first electrode and a second color OLED patterned on a second electrode. The final fabrication step includes depositing the top electrodes 28a, 28b on top of the organic stacks 26a, 26b and the resulting OLED array is as shown. The organic stacks 26a, 26b are formed upon bottom electrodes 14a, 14b, respectively. The bottom electrodes 14a, 14b are formed upon a substrate 10 comprising an oxide layer 12 and the top electrodes 28a, 28b, in this embodiment are cathodes. The top electrode 28a, 28b can comprise, for example, a reflective metal, a semi-transparent, thin-film metal or a transparent conductive oxide such as, for example, Indium Tin Oxide (ITO), Fluorine Doped Tin Oxide (FTO) or Aluminum-doped Zinc Oxide (AZO) and Indium-doped Zinc Oxide (IZO), or Ga-doped Zinc Oxide (ZnO). The bottom electrodes 14a, 14b can be deposited, for example, with sputtering, evaporation, or spin coating techniques.

Figure 6A:
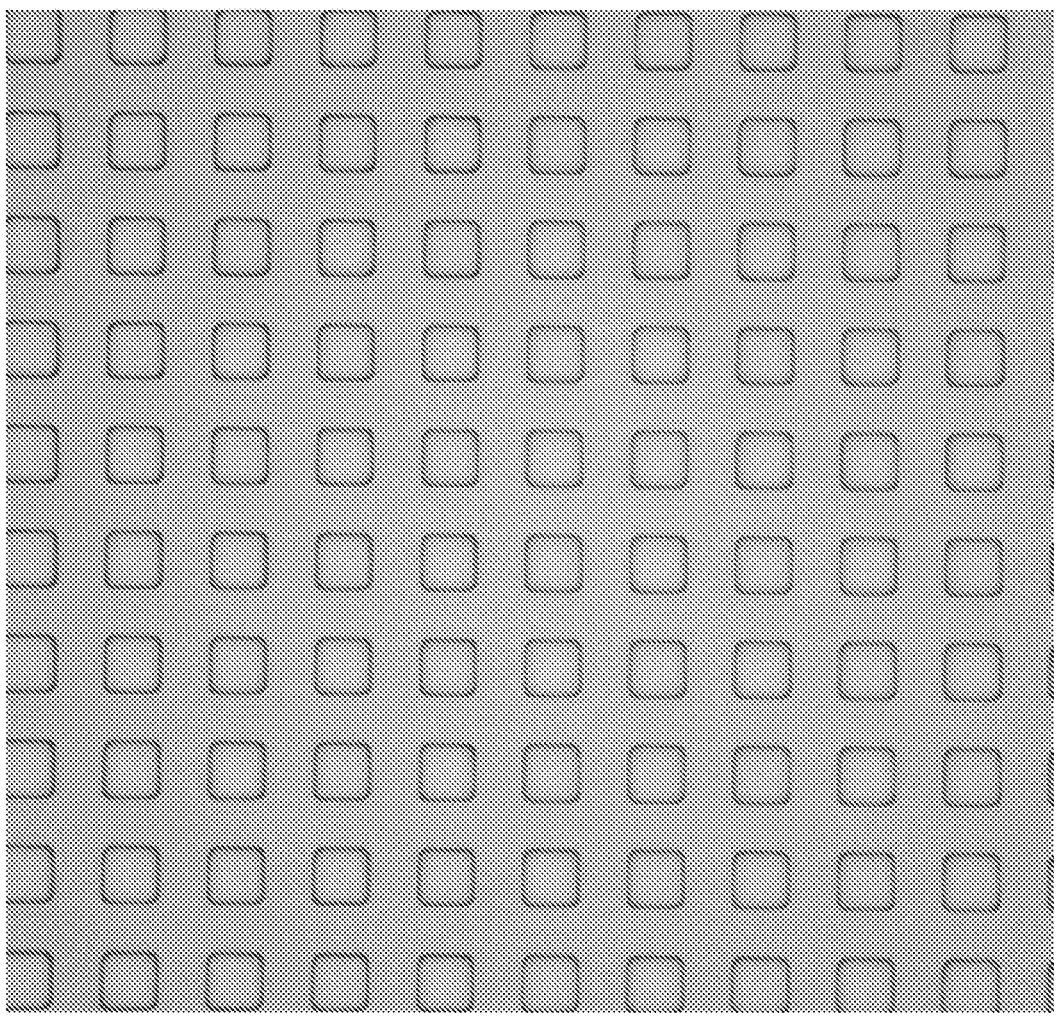
FIG. 6A illustrates a top view image captured using an optical microscope of a first pattern following the development of the trilayer resist system.
Figure 6B:
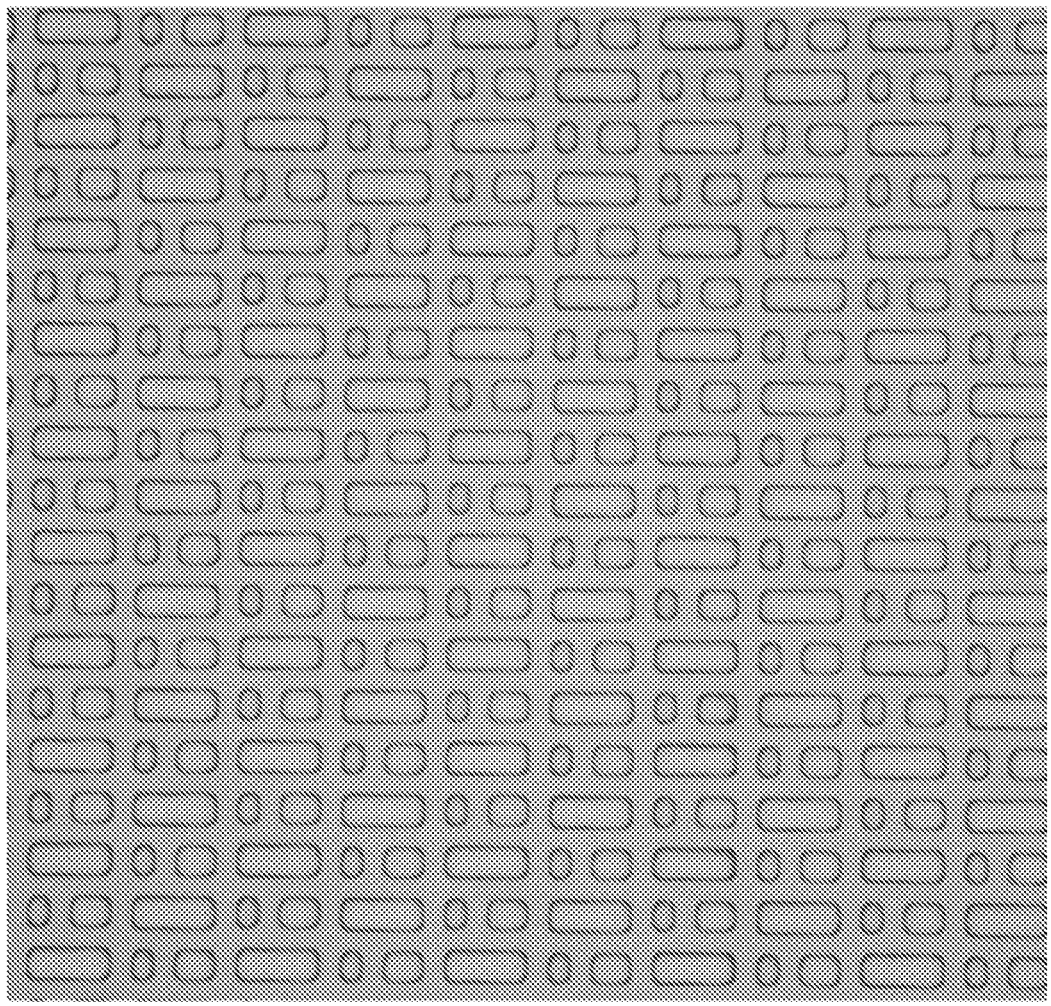
FIG. 6B illustrates a top view image captured using an optical microscope of a second pattern following the development of the trilayer resist system.
Figure 6C:
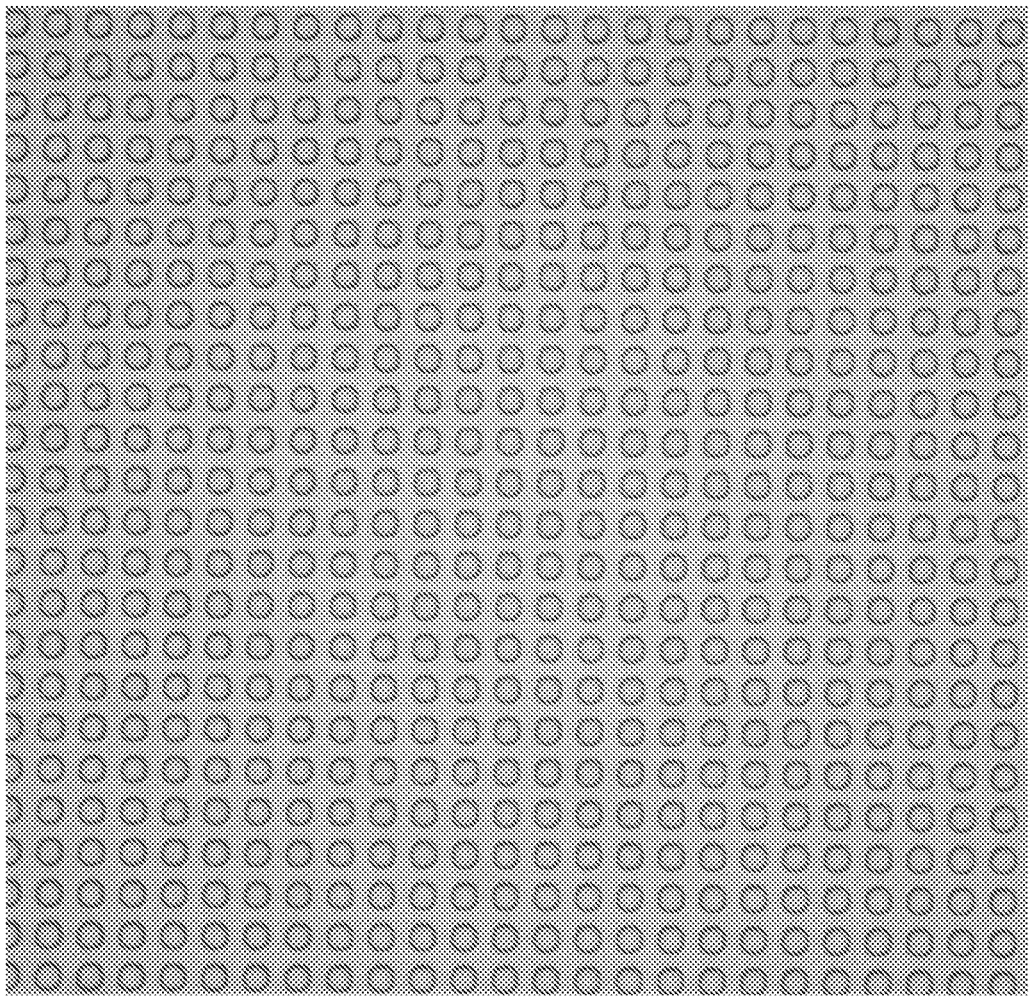
FIG. 6C illustrates a top view image captured using an optical microscope of a third pattern following the development of the trilayer resist system.

FIG. 6A illustrates a top view image captured using an optical microscope of a first pattern following the photolithographic development of the positive-type photoresist layer of the trilayer resist system. FIG. 6B illustrates a top view image captured using an optical microscope of a second pattern following the photolithographic development of the positive-type photoresist layer of the trilayer resist system. FIG. 6C illustrates a top view image captured using an optical microscope of a third pattern following the photolithographic development of the positive-type photoresist layer of the trilayer resist system.

Figure 7:
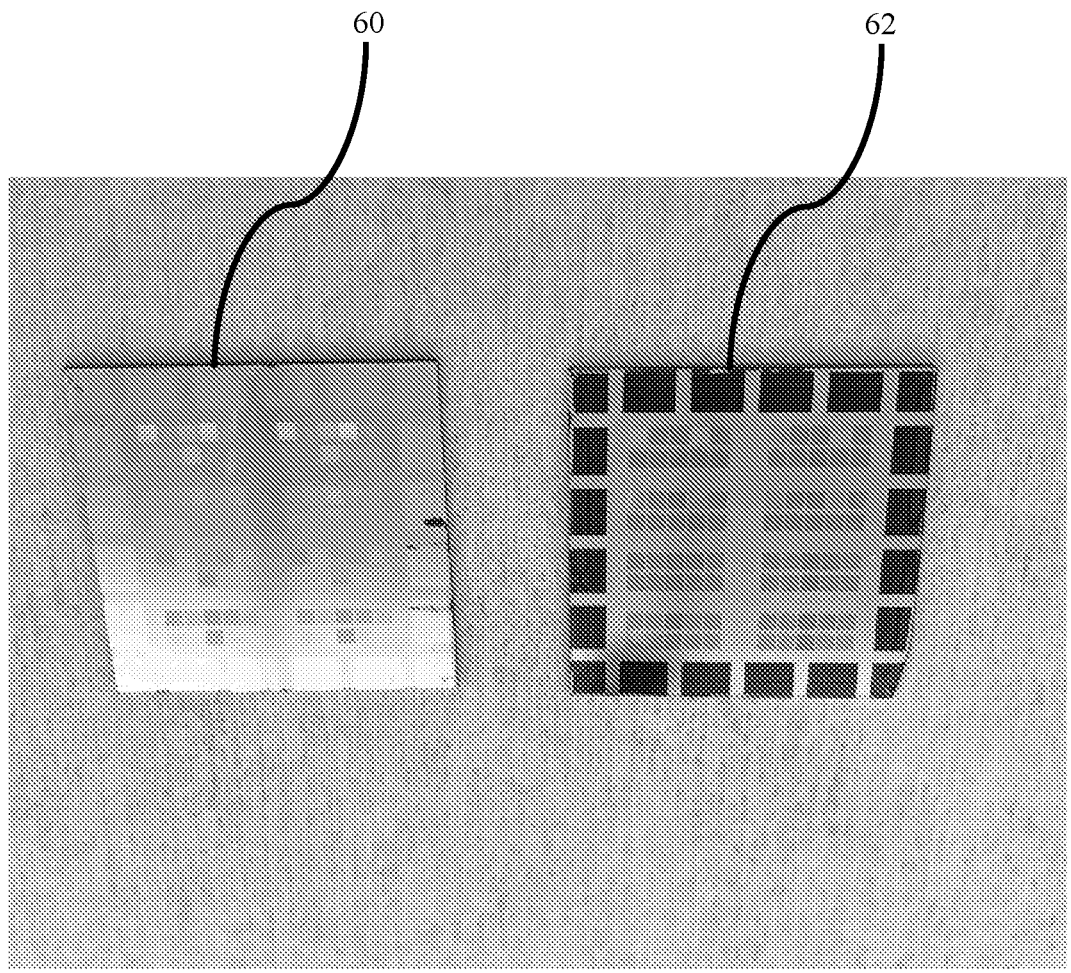
FIG. 7 illustrates the inorganic transfer layer before and after etching.

The inorganic transfer layer was then etched using wet etching technique, as illustrated in FIG. 7. FIG. 7 shows the inorganic transfer layer on a wafer before etching 60 and the same wafer after the etching process 62. In an embodiment, the etchant solution can be, for example, one or more of phosphoric acid, nitric acid, acetic acid and/or water. It is possible to perform an additional intermediate etching steps using a different etching method between a first and second transfer layer wet etching step.

Figure 8A:
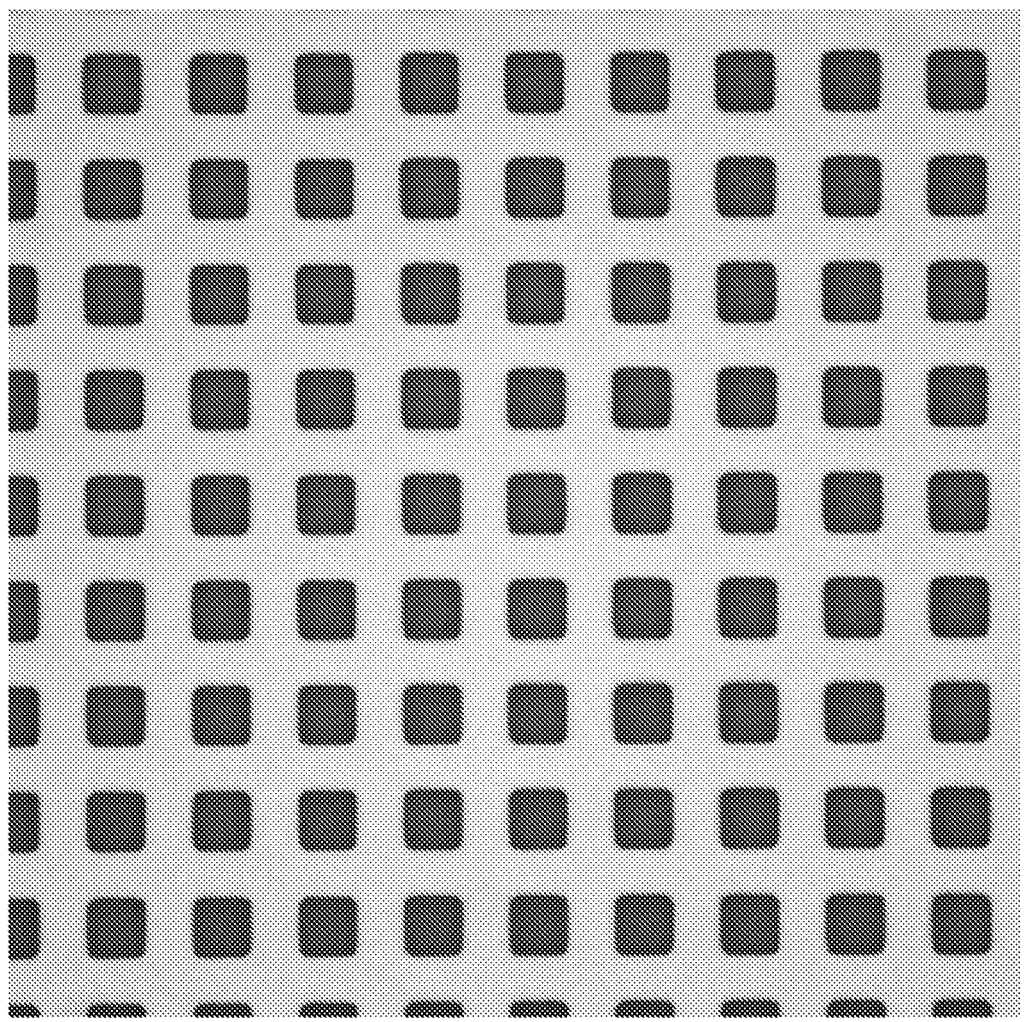
FIG. 8A illustrates a top view image captured using an optical microscope of a first pattern following the wet etch of the inorganic transfer layer.
Figure 8B:
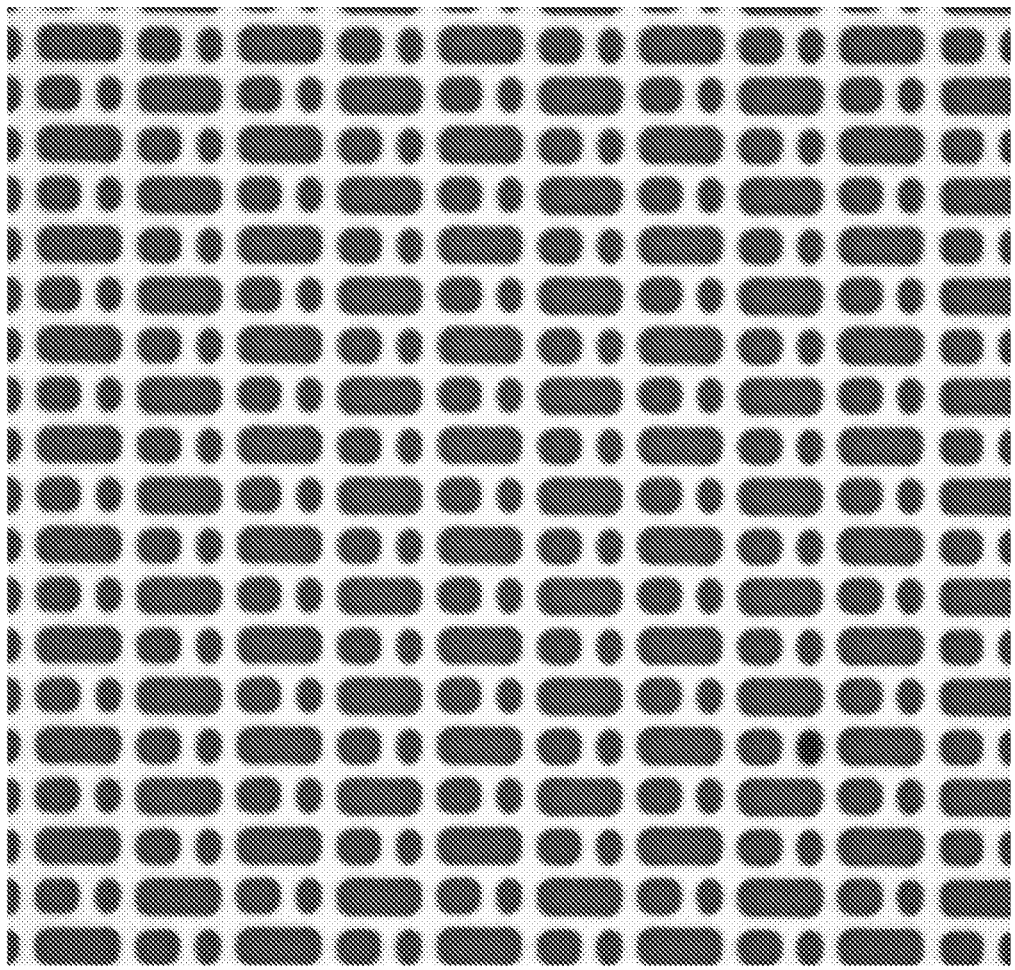
FIG. 8B illustrates a top view image captured using an optical microscope of a second pattern following the wet etch of the inorganic transfer layer.
Figure 8C:
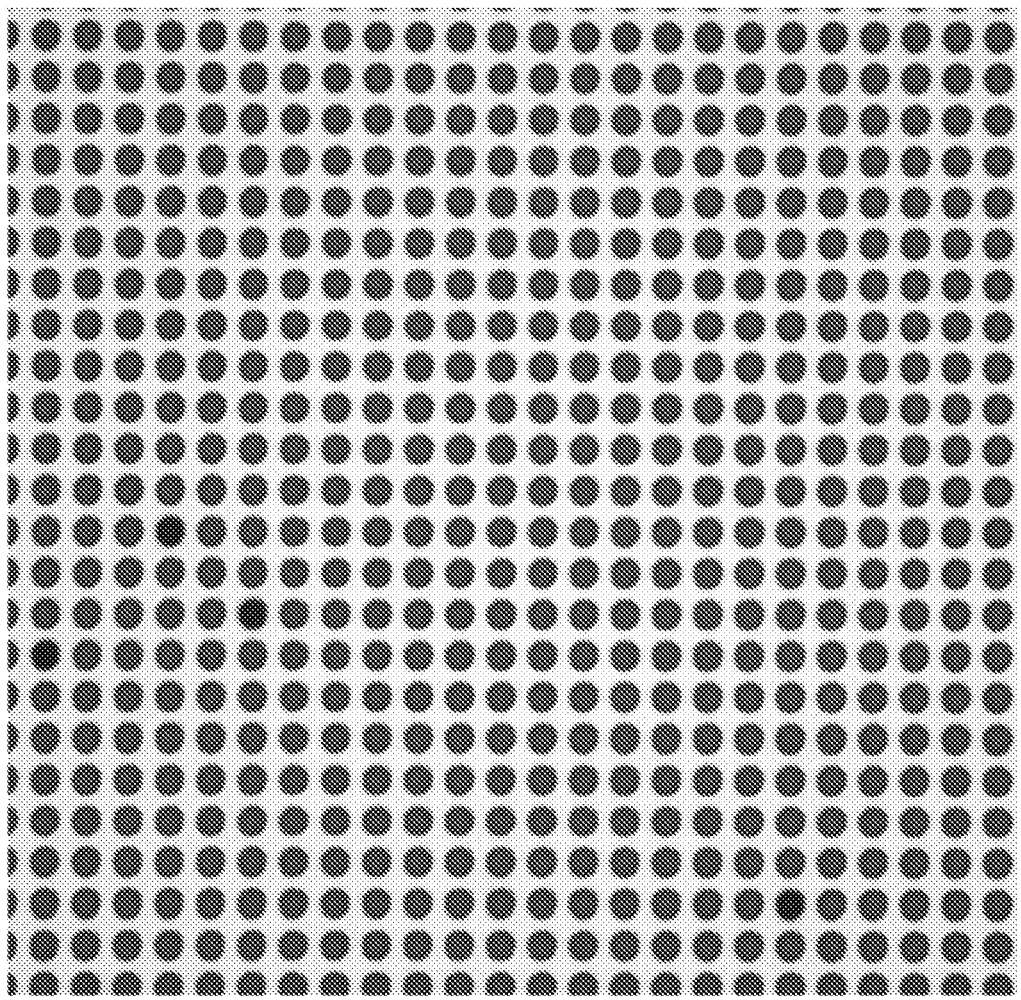
FIG. 8C illustrates a top view image captured using an optical microscope of a third pattern following the wet etch of the inorganic transfer layer.

FIG. 8A illustrates a top view image captured using an optical microscope of a first pattern following the wet etch of the inorganic transfer layer. FIG. 8B illustrates a top view image captured using an optical microscope of a second pattern following the wet etch of the inorganic transfer layer. FIG. 8C illustrates a top view image captured using an optical microscope of a third pattern following the wet etch of the inorganic transfer layer.

Figure 9A:
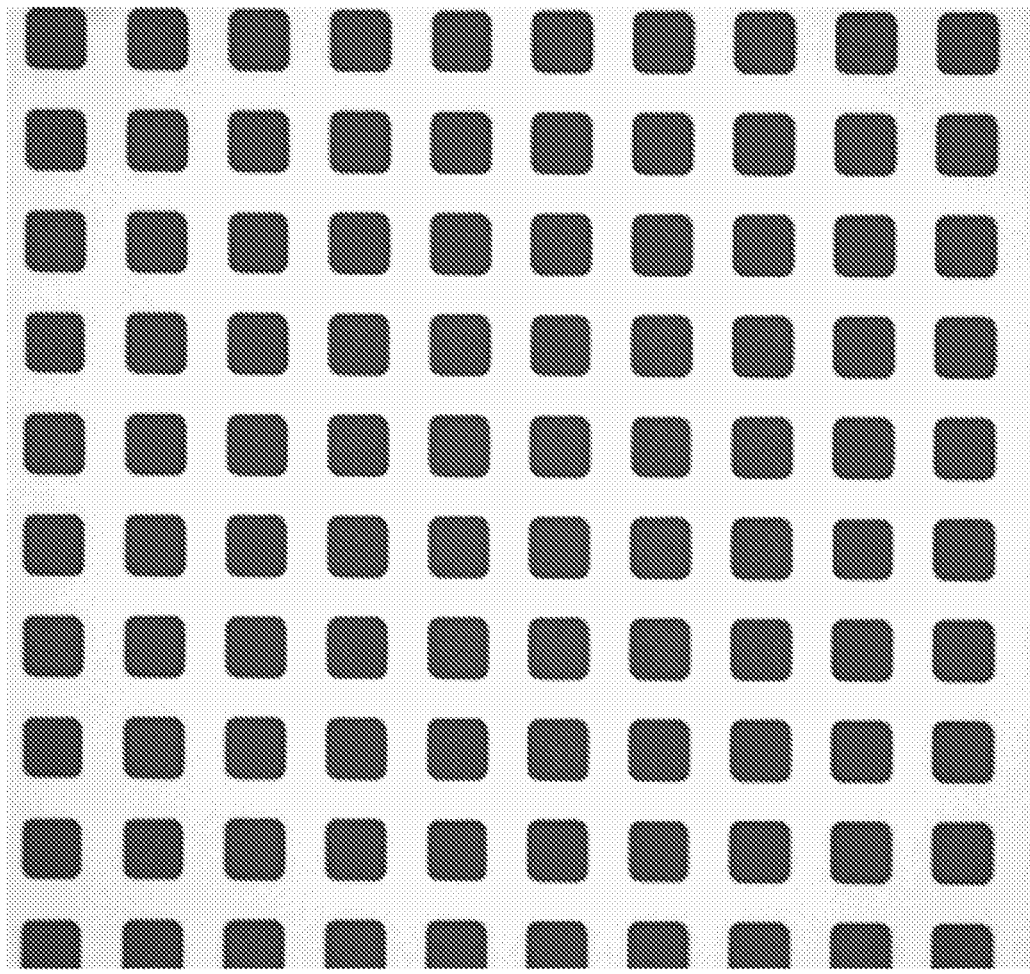
FIG. 9A illustrates a top view image captured using an optical microscope of a first pattern following the dry etching of the fluoropolymer base layer.
Figure 9B:
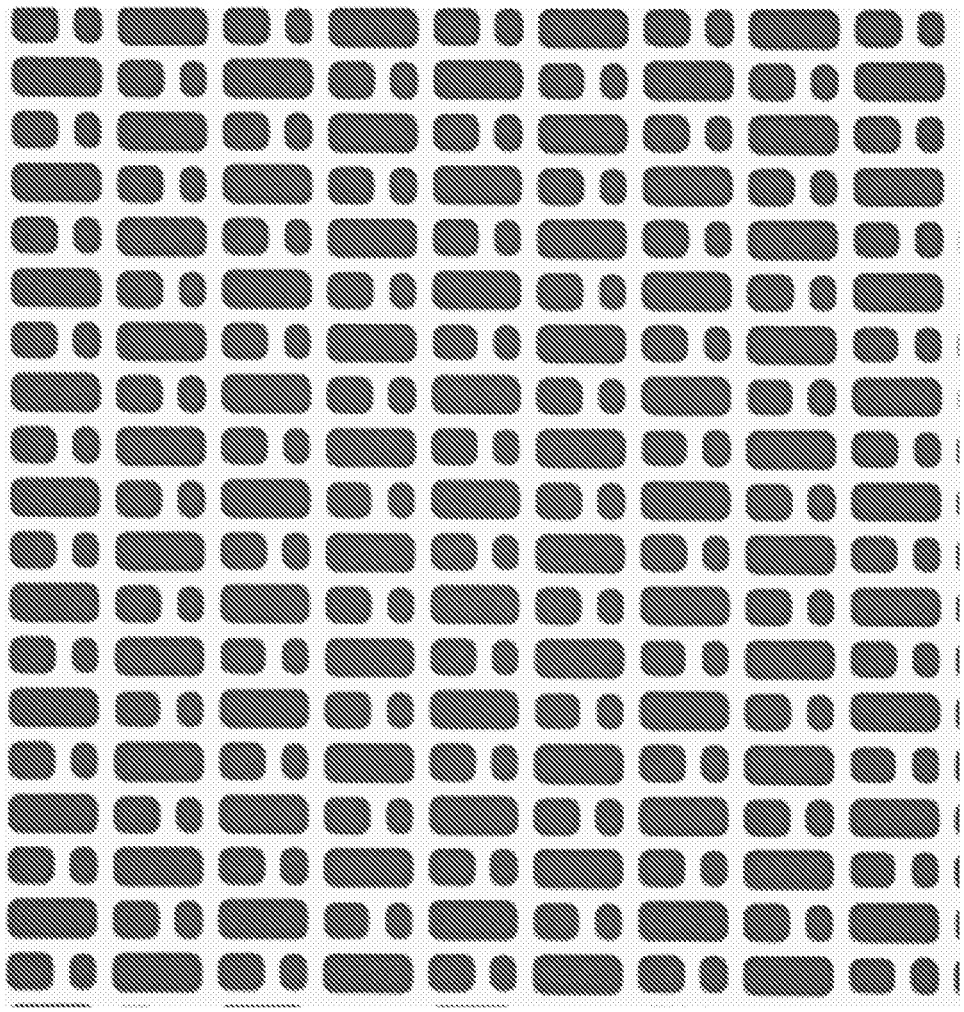
FIG. 9B illustrates a top view image captured using an optical microscope of a second pattern following the dry etching of the fluoropolymer base layer.
Figure 9C:
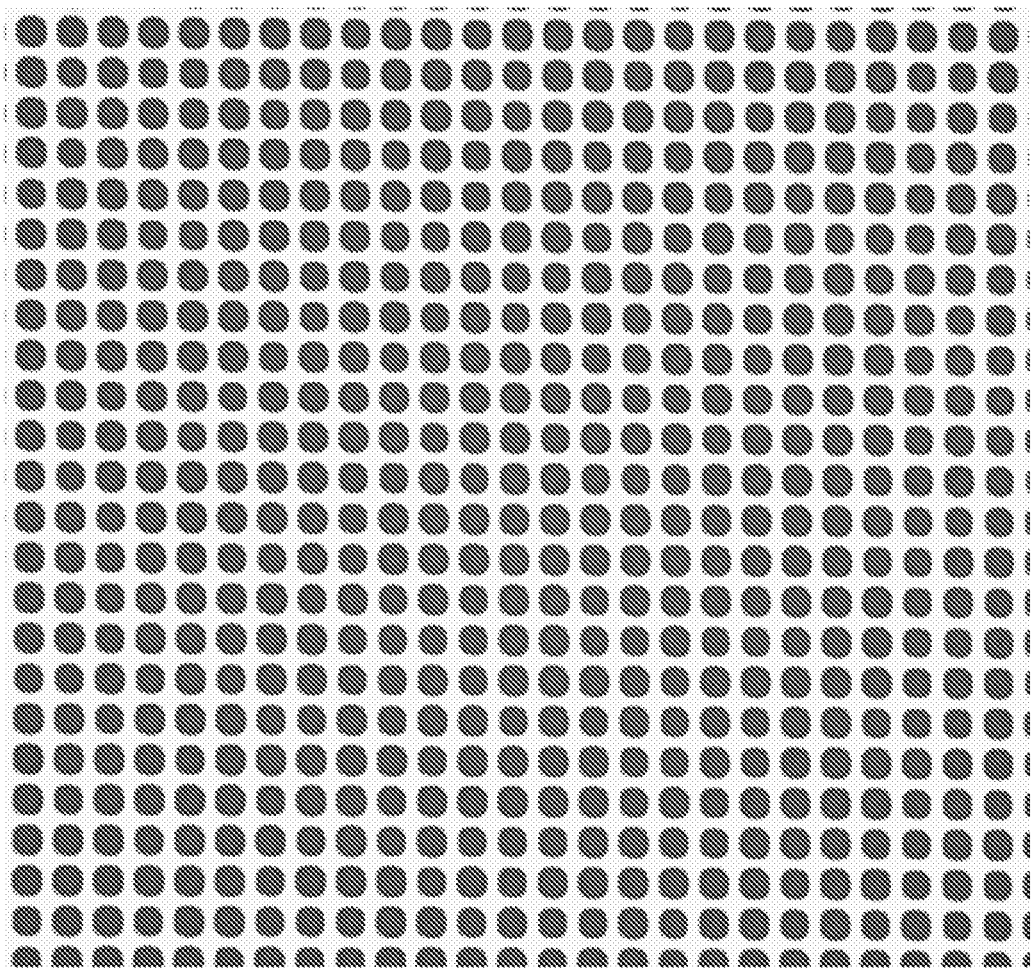
FIG. 9C illustrates a top view image captured using an optical microscope of a third pattern following the dry etching of the fluoropolymer base layer.

FIG. 9A illustrates a top view image captured using an optical microscope of a first pattern following the dry etching of the fluoropolymer base layer. The fluoropolymer base layer was etched with an $O_2$ plasma using dry etching technique. FIG. 9B illustrates a top view image captured using an optical microscope of a second pattern following the dry etching of the fluoropolymer base layer. FIG. 9C illustrates a top view image captured using an optical microscope of a third pattern following the dry etching of the fluoropolymer base layer.

Figure 10:
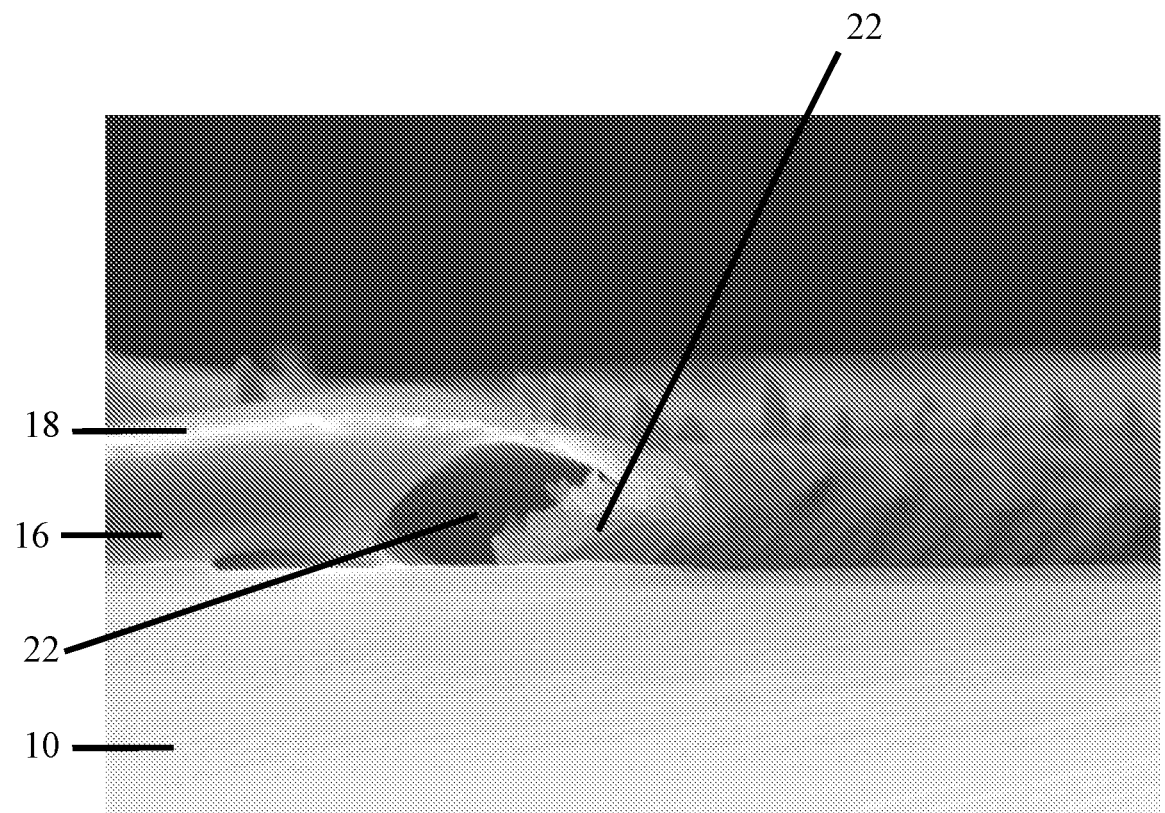
FIG. 10 illustrates a profile view image captured by a Field Emission Scanning Electron Microscope (FESEM) of an undercut in the fluoropolymer base layer.
Figure 11A:
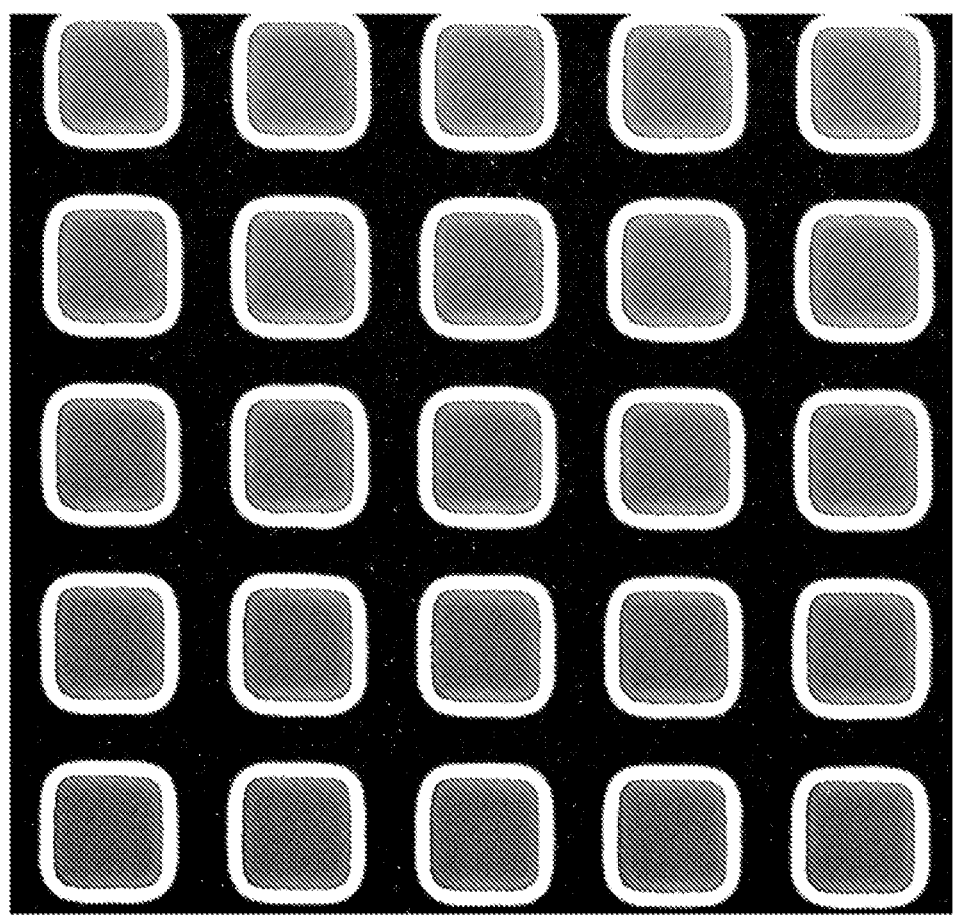
FIG. 11A illustrates a top view image captured by a Field Emission Scanning Electron Microscope (FESEM) following successful patterning of the trilayer resist system for a first pattern.
Figure 11B:
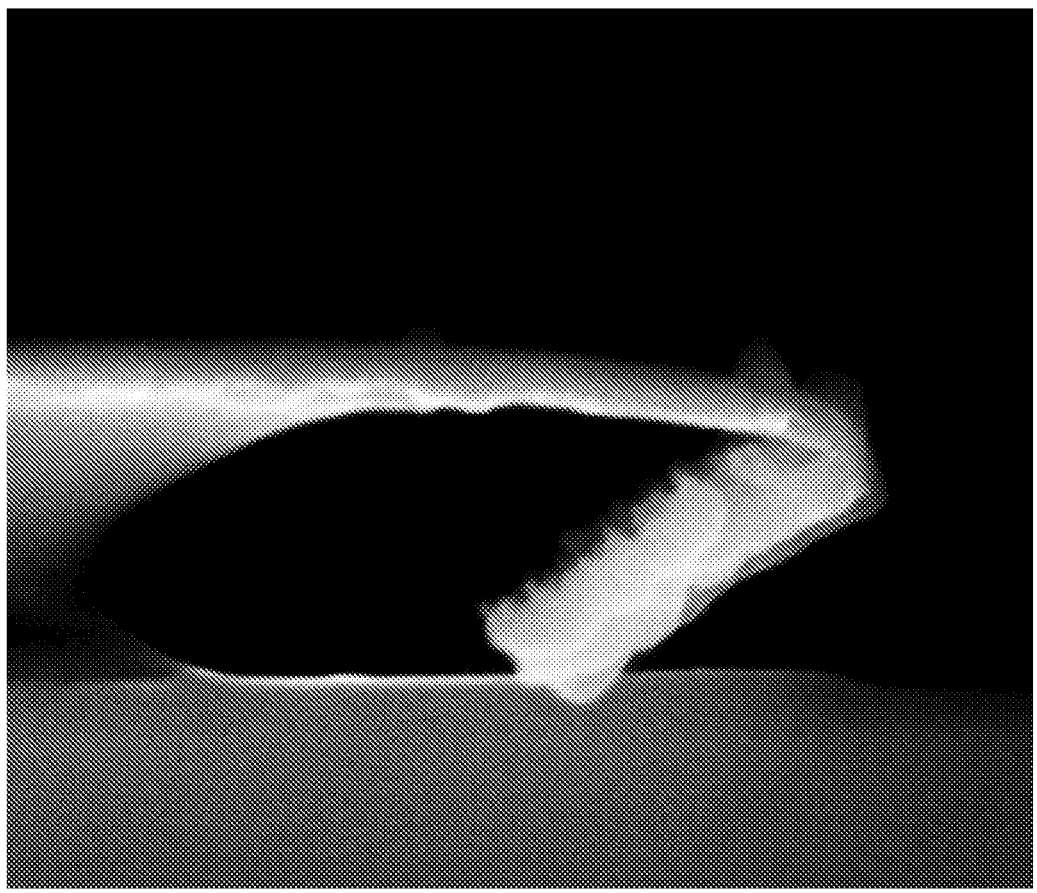
FIG. 11B illustrates a side profile view image captured by the FESEM further illustrating the side profile of the undercut formed in the base layer of the first pattern.
Figure 11C:
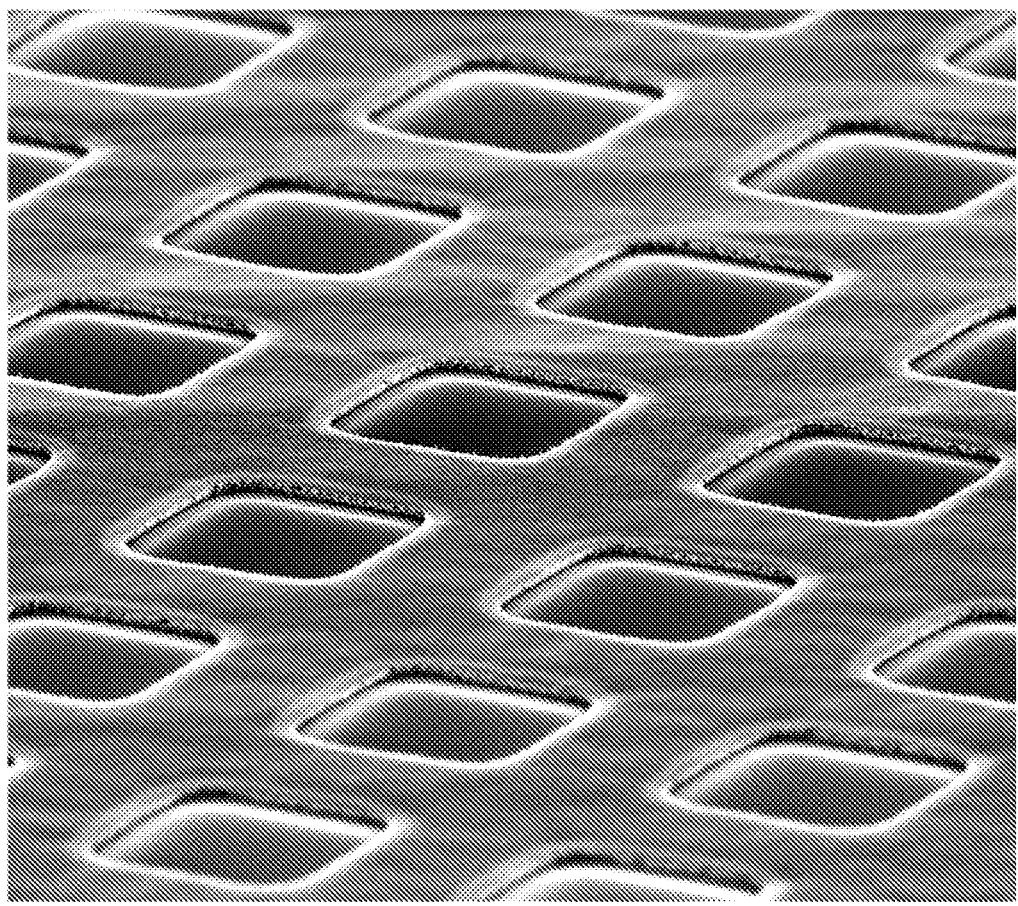
FIG. 11C illustrates an isometric view image captured by the FESEM following successful patterning of the trilayer resist system for the first pattern.

FIG. 10 illustrates a profile view image captured by a Field Emission Scanning Electron Microscope (FESEM) of an undercut in the fluoropolymer base layer. The undercut to facilitate the liftoff of the CYTOP base layer was created using high-pressure-low-power O2 plasma process for 30 min. It was discovered that during the dry etching of the CYTOP base layer with vertical O2 plasma etching with less pressure and high power, strands 48 were formed and hung from the sidewall of the inorganic transfer layer, bending in towards the undercut region 22, as illustrated in FIG. 10. It was determined that these strands 48 were CYTOP did not cause any issues for liftoff, however, slight modifications to the etch of the base layer were successful in removing them. FIG. 11A illustrates a top view image captured by a Field Emission Scanning Electron Microscope (FESEM) following successful patterning of the trilayer resist system for a first pattern. FIG. 11B illustrates a side profile view image captured by the FESEM further illustrating the side profile of the undercut formed in the CYTOP bare layer of the first pattern. FIG. 11C illustrates an isometric view image captured by the FESEM following successful patterning of the trilayer resist system for the first pattern.

FIG. 11A illustrates a top view image captured by a Field Emission Scanning Electron Microscope (FESEM) following successful patterning of the trilayer resist system, prior to the deposition of an organic layer, for a first pattern. FIG. 11B illustrates a side profile view image captured by the FESEM further illustrating the side profile of the undercut formed in the fluoropolymer base layer, prior to the deposition of an organic layer, of the first pattern. FIG. 11C illustrates an isometric view image captured by the FESEM following successful patterning of the trilayer resist system, prior to the deposition of an organic layer, for the first pattern.

Figure 12:
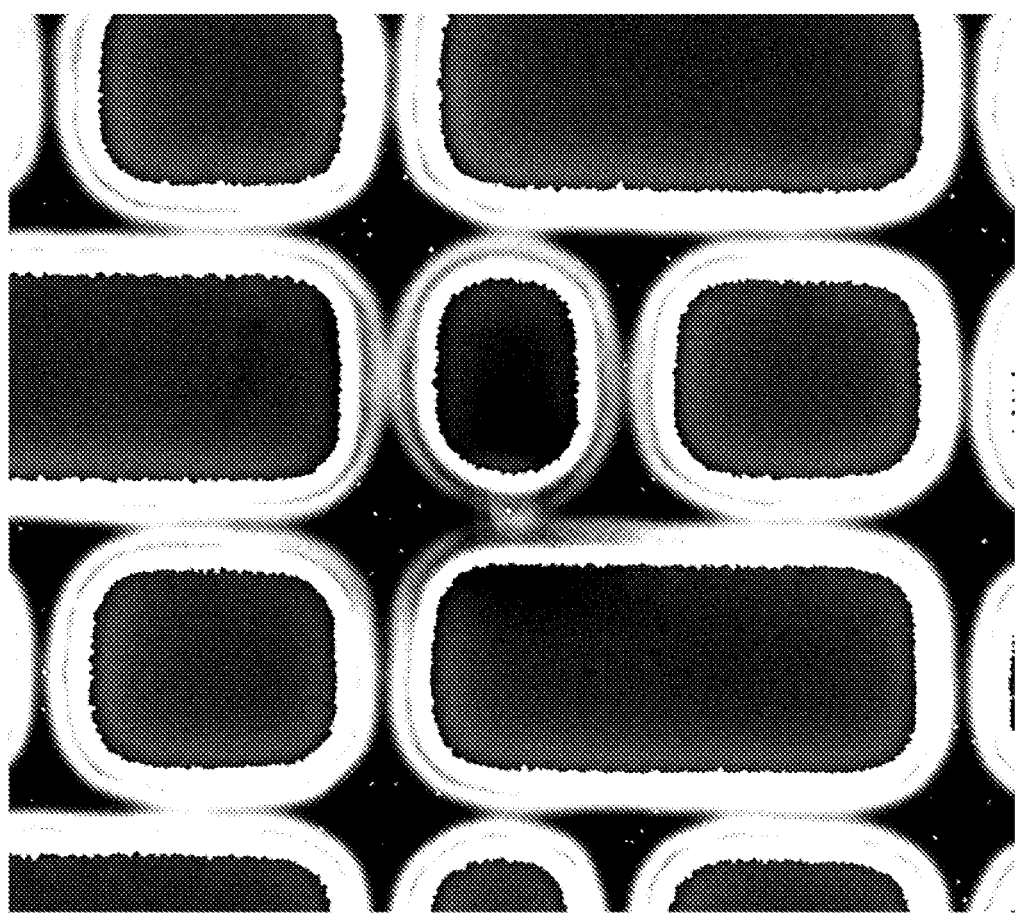
FIG. 12 illustrates a top view image captured by the FESEM following successful patterning of the trilayer resist system for a second pattern.

FIG. 12 illustrates a top view image captured by the FESEM following successful patterning of the trilayer resist system, prior to the deposition of an organic layer, for a second pattern.

Figure 13A:
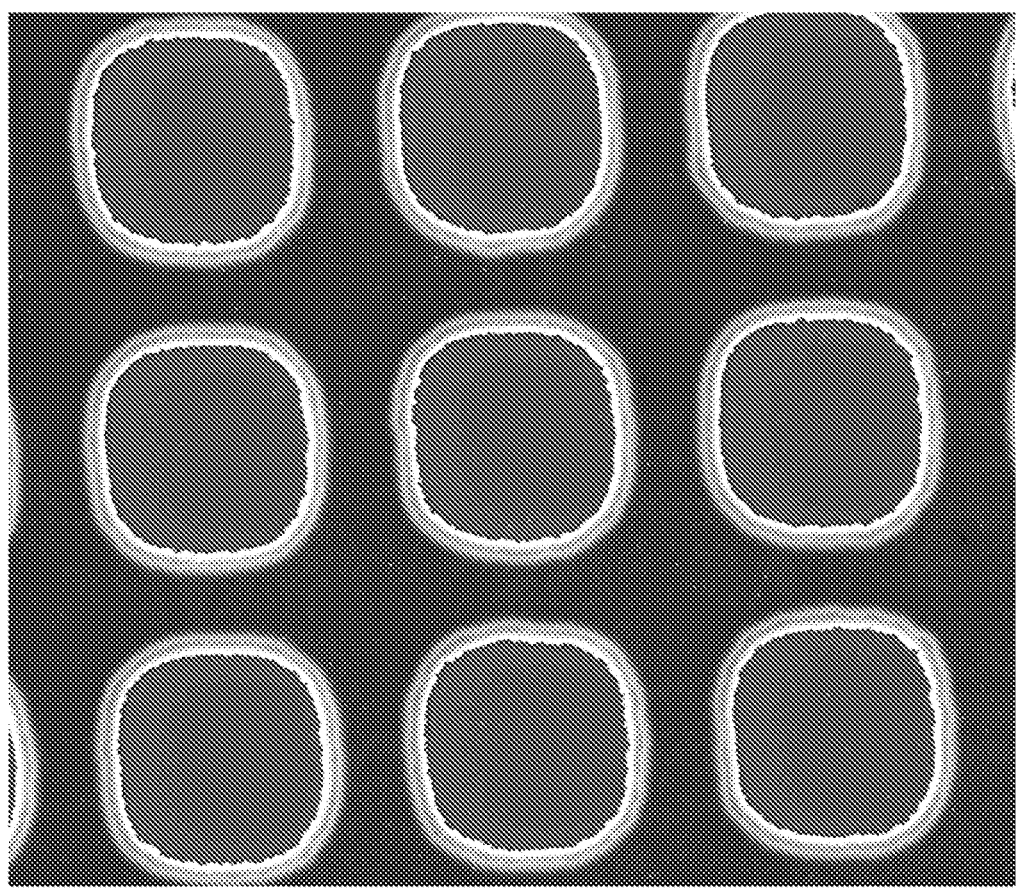
FIG. 13A illustrates a top view image captured by the FESEM following successful patterning of the trilayer resist system for a third pattern.
Figure 13B:
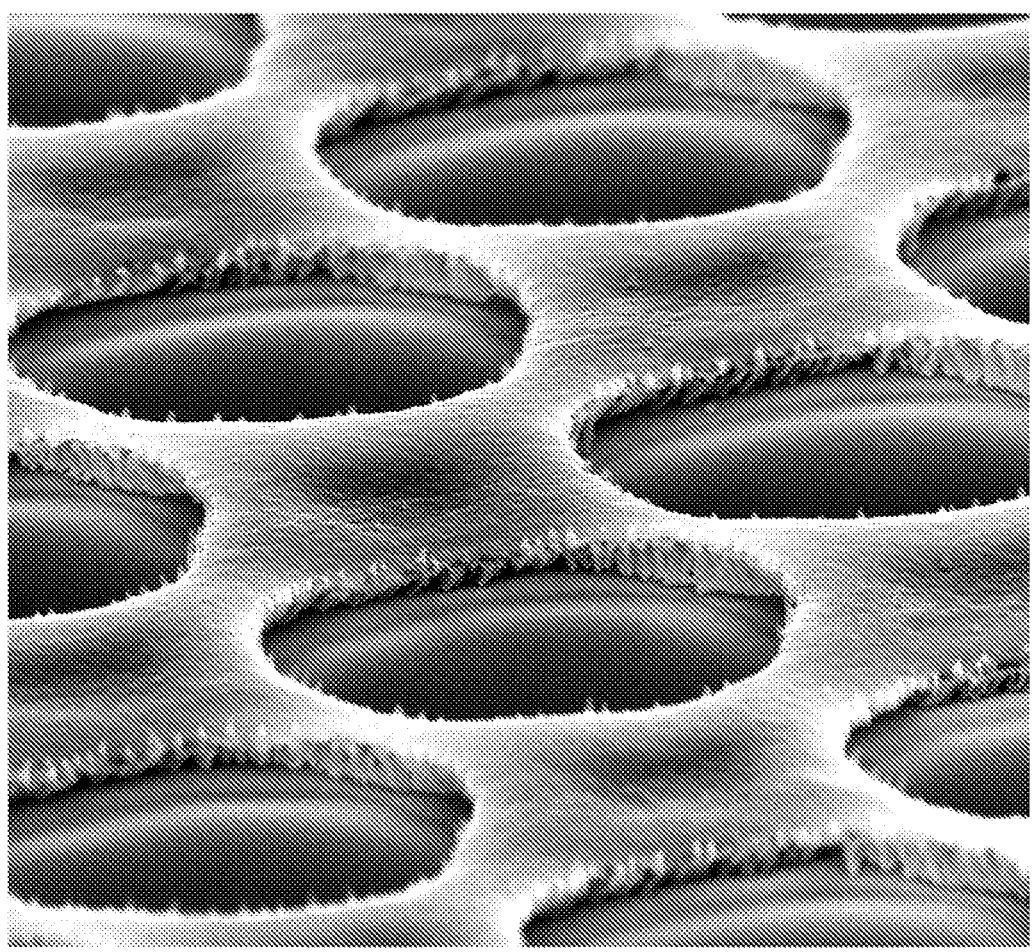
FIG. 13B illustrates an isometric view image captured by the FESEM following successful patterning of the trilayer resist system for the third pattern.

FIG. 13A illustrates a top view image captured by the FESEM following successful patterning of the trilayer resist system, prior to the deposition of an organic layer, for a third pattern. FIG. 13B illustrates an isometric view image captured by the FESEM following successful patterning of the trilayer resist system, prior to the deposition of an organic layer, for the third pattern.

Figure 14A:
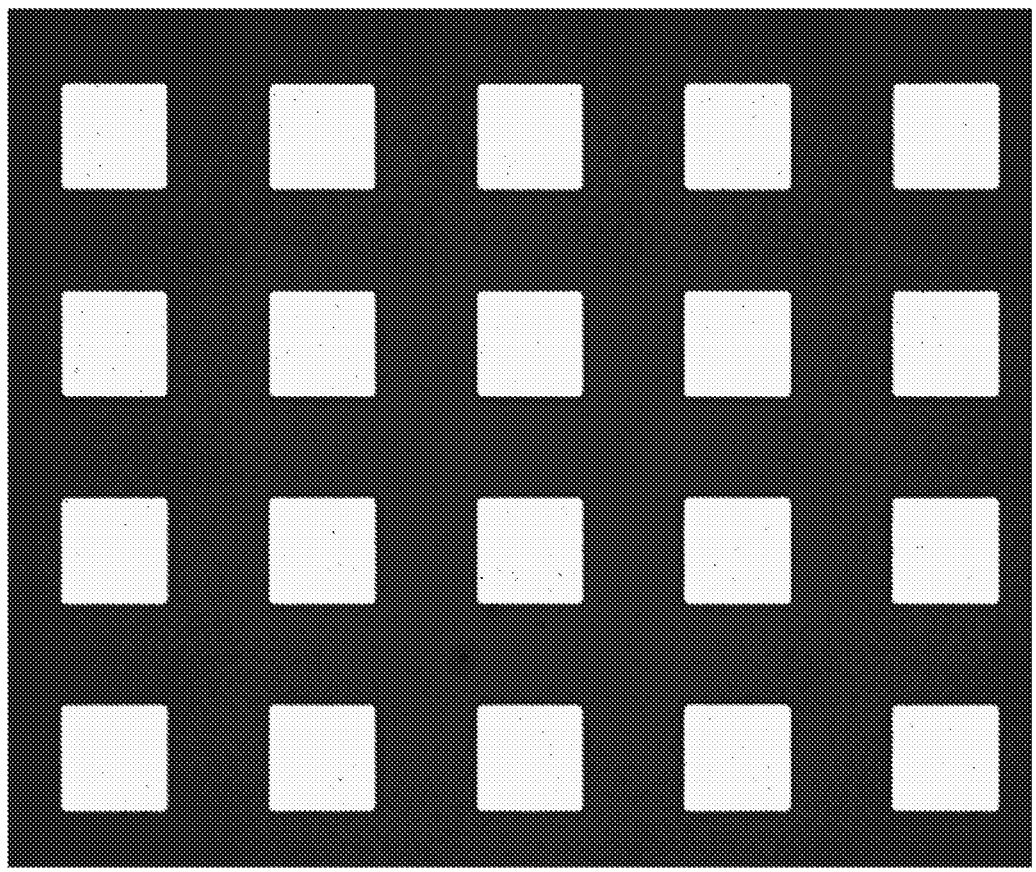
FIG. 14A illustrates a top view image captured using an optical microscope of a first pattern following the liftoff of the fluoropolymer base layer.
Figure 14B:
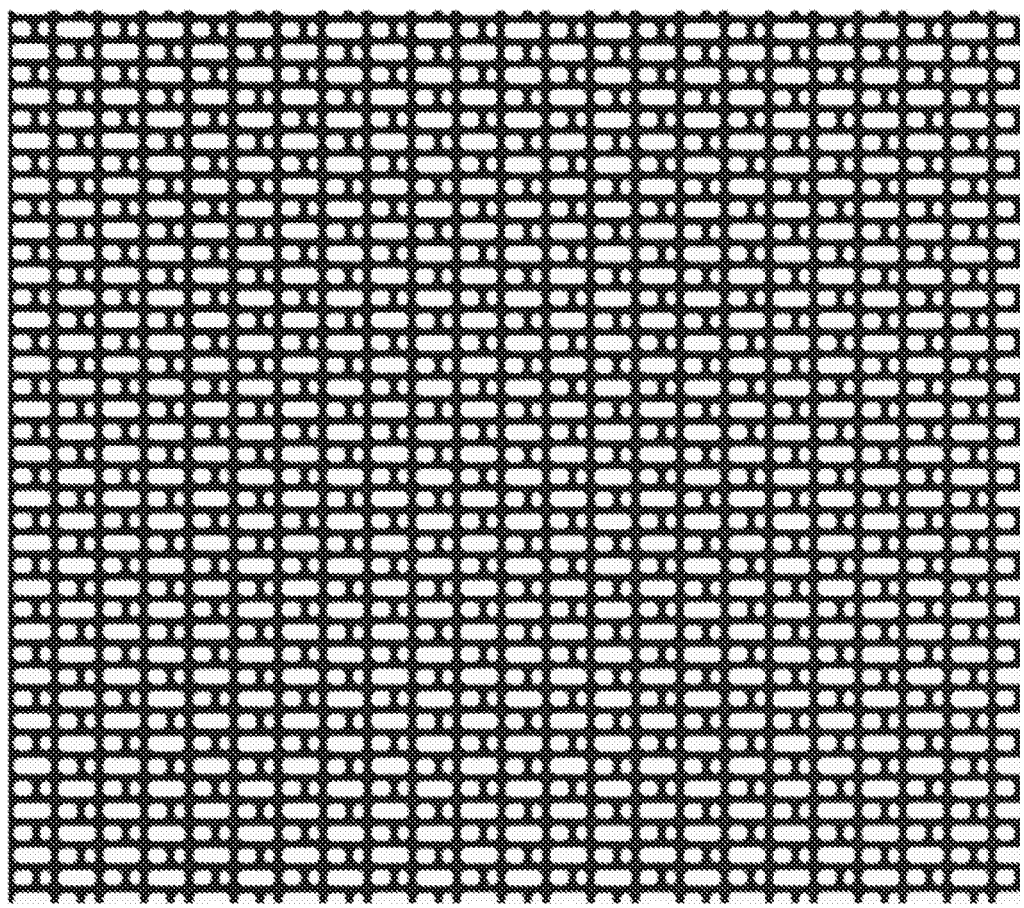
FIG. 14B illustrates a top view image captured using an optical microscope of a second pattern following the liftoff of the fluoropolymer base layer.
Figure 14C:
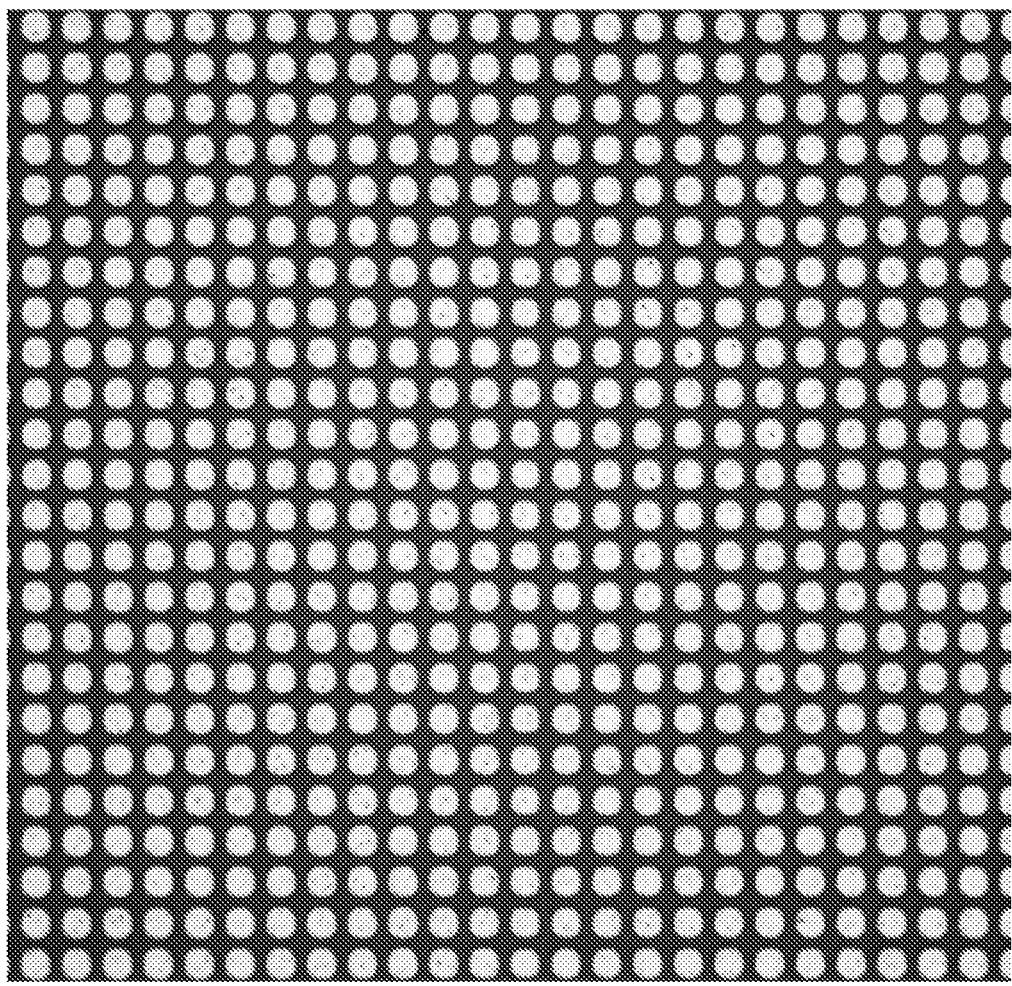
FIG. 14C illustrates a top view image captured using an optical microscope of a third pattern following the liftoff of the fluoropolymer base layer.

To achieve the liftoff of all of the remaining components of the trilayer photoresist system the substrate was immersed in CT-Solve100E and sonication was performed. FIG. 14A illustrates a top view image captured using an optical microscope of a first pattern following the liftoff of the fluoropolymer base layer, illustrating the successful patterning of an array of clean bottom electrodes ready for the deposition of organic devices. FIG. 14B illustrates an image captured using an optical microscope of a second pattern following the liftoff of the fluoropolymer base layer, illustrating the successful patterning of an array of clean bottom electrodes ready for the deposition of organic devices. FIG. 14C illustrates an image captured using an optical microscope of a third pattern following the liftoff of the fluoropolymer base layer, illustrating the successful patterning of an array of clean bottom electrodes ready for the deposition of organic devices.

All publications, patents and patent applications mentioned in this specification are indicative of the level of skill of those skilled in the art to which this invention pertains and are herein incorporated by reference. The reference to any prior art in this specification is not, and should not be taken as, an acknowledgement or any form of suggestion that such prior art forms part of the common general knowledge.

The invention being thus described, it will be obvious that the same may be varied in many ways. Such variations are not to be regarded as a departure from the scope of the invention, and all such modifications as would be obvious to one skilled in the art are intended to be included within the scope of the following claims.

We claim:

1. A method for patterning an organic device comprising:
   depositing a bottom electrode on a substrate;
   depositing a trilayer resist system on the substrate comprising:
      a fluoropolymer base layer;
      an intermediate inorganic transfer layer; and
      a top positive-type photoresist layer; and
   creating at least one organic device by:
      patterning the top positive-type photoresist layer using photolithography to create an image layer aligned with the bottom electrode;
      etching the intermediate inorganic transfer layer exposed through the image layer;
      etching the fluoropolymer base layer exposed through the inorganic transfer layer to expose the bottom electrode using reactive ion etching;
      depositing at least one organic layer above the exposed bottom electrode;
      performing a liftoff procedure to remove any remaining components of the trilayer resist system; and
      depositing a top electrode on top of the organic layer.

2. The method of claim 1, wherein the organic device is an organic light emitting diode.

3. The method of claim 1, wherein the organic device is an organic field-effect transistor, organic solar cell, photovoltaic cell device, organic semiconductor, or an organic laser.

4. The method of claim 1, wherein the fluoropolymer base layer has a visible light transmission ratio of 95% or greater.

5. The method of claim 1, wherein the positive-type photoresist layer has a thickness of between about 340-500 nm.

6. The method of claim 1, wherein etching the inorganic transfer layer through the patterned positive-type photoresist layer creates an undercut region between the positive-type photoresist image layer and the inorganic transfer layer.

7. The method of claim 1, wherein etching the fluoropolymer base layer creates a lateral undercut profile and a longitudinal undercut profile.

8. The method of claim 7, wherein the lateral undercut profile is ≥0.25 µm in length.

9. The method of claim 1, wherein the liftoff procedure utilizes a fluorinated solvent to dissolve the fluoropolymer base layer.

10. The method of claim 1, wherein the inorganic transfer layer comprises one or more of a metal and a dielectric material.

11. The method of claim 1, wherein the at least one organic layer comprises one or more electron transport layers (ETL), emission layers (EML), hole transport layers (HTL), and hole injection layers (HIL).

12. The method of claim 11, wherein the emission layer (EML) is at least one of red, green, and blue color emission.

13. The method of claim 1, wherein an oxide layer is deposited on the substrate and electrode array before deposition of the trilayer resist system.

14. The method of claim 13, wherein the oxide layer comprises a transparent conducting oxide.

15. A method for patterning an organic device array comprising:
   depositing an array of bottom electrodes on a substrate;
   depositing a trilayer resist system on the substrate using a trilayer resist deposition method comprising:
      a fluoropolymer base layer;
      an intermediate inorganic transfer layer; and
      a top positive-type photoresist layer; and
   creating a plurality of organic devices for a first set of organic devices using an organic device deposition method comprising:
      patterning the top positive-type photoresist layer using photolithography to create an image layer aligned with a set of the array of bottom electrodes;
      etching the intermediate inorganic transfer layer exposed through the image layer;

etching the fluoropolymer base layer exposed through the inorganic transfer layer using reactive ion etching to expose the set of the array of bottom electrodes;

depositing at least one organic layer above the set of exposed bottom electrodes;

performing a liftoff procedure to remove any remaining components of the trilayer resist system; and repeating the trilayer resist deposition method to deposit the trilayer resist system on the substrate;

repeating the organic device deposition method to create a second set of organic devices aligned with a second set of bottom electrodes; and repeating the liftoff procedure to remove any remaining components of the trilayer resist system.

16. The method of claim 15, further comprising depositing a top electrode on top of each of the organic devices.

17. The method of claim 15, wherein the organic device is an OLED, and wherein the first set of organic devices and the second set of organic devices emit different colors.

18. The method of claim 15, wherein etching the inorganic transfer layer through the patterned positive-type photoresist image layer creates an undercut region between the positive-type photoresist image layer and the inorganic transfer layer.

19. The method of claim 15 wherein etching the fluoropolymer base layer creates a lateral undercut profile and a longitudinal undercut profile.

20. The method of claim 19 wherein the lateral undercut profile is ≥0.25 μm in length.

21. The method of claim 15, wherein the liftoff procedure utilizes a fluorinated solvent that interacts and dissolves the fluoropolymer base layer.

22. The method of claim 15, wherein the inorganic transfer layer comprises one or more metal or dielectric material.

23. The method of claim 15, wherein the organic layer is an organic stack comprising one or more electron transport layers (ETL), emission layers (EML), hole transport layers (HTL), and hole injection layers (HIL).

24. A method for patterning an organic device array comprising:

depositing a plurality of bottom electrodes on a substrate;

depositing a trilayer resist system on the substrate using a trilayer resist deposition method comprising:
  a fluoropolymer base layer;
  an intermediate inorganic transfer layer; and
  a top positive-type photoresist layer; and creating a plurality of organic devices using an organic device deposition method comprising:
  patterning the top positive-type photoresist layer using photolithography to create an image layer aligned with the plurality of bottom electrodes;
  etching the intermediate inorganic transfer layer exposed through the image layer;
  etching the fluoropolymer base layer exposed through the inorganic transfer layer using reactive ion etching to expose the plurality of bottom electrodes; and
  depositing at least one organic layer above the set of exposed bottom electrodes; and performing a liftoff procedure to remove any remaining components of the trilayer resist system.

* * * * *